(12) United States Patent
Uno et al.

(10) Patent No.: US 8,247,911 B2
(45) Date of Patent: Aug. 21, 2012

(54) WIRE BONDING STRUCTURE AND METHOD FOR FORMING SAME

(75) Inventors: Tomohiro Uno, Futtsu (JP); Shinichi Terashima, Futtsu (JP); Keiichi Kimura, Futtsu (JP); Takashi Yamada, Iruma (JP); Akihito Nishibayashi, Iruma (JP)

(73) Assignees: Nippon Steel Materials Co., Ltd., Tokyo (JP); Nippon Micrometal Corporation, Saitama (JP)

( * ) Notice: Subject to any disclaimer, the term of this patent is extended or adjusted under 35 U.S.C. 154(b) by 454 days.

(21) Appl. No.: 12/445,789

(22) PCT Filed: Jan. 15, 2008

(86) PCT No.: PCT/JP2008/050314
§ 371 (c)(1), (2), (4) Date: Jun. 26, 2009

(87) PCT Pub. No.: WO2008/087922
PCT Pub. Date: Jul. 24, 2008

(65) Prior Publication Data
US 2010/0213619 A1     Aug. 26, 2010

(30) Foreign Application Priority Data
Jan. 15, 2007 (JP) .................... 2007-006446

(51) Int. Cl.
*H01L 23/488* (2006.01)
*H01L 21/60* (2006.01)

(52) U.S. Cl. ......... 257/780; 257/E23.023; 257/E21.509; 257/783; 257/784; 257/786; 438/617

(58) Field of Classification Search ............ 257/780, 257/E23.023, E21.509, 783, 784, 786; 438/617
See application file for complete search history.

(56) References Cited

U.S. PATENT DOCUMENTS
5,455,195 A * 10/1995 Ramsey et al. ............... 438/612
(Continued)

FOREIGN PATENT DOCUMENTS
JP        61058247        3/1986
(Continued)

OTHER PUBLICATIONS

Kaimori, et al., Development of "Hybrid Bonding Wire", SEI Technical Review, vol. 169, No. 47, Jul. 2006.
(Continued)

*Primary Examiner* — A O Williams
(74) *Attorney, Agent, or Firm* — McDermott Will & Emery LLP

(57) ABSTRACT

Provided is a bonding structure of a bonding wire and a method for forming the same which can solve problems of conventional technologies in practical application of a multilayer copper wire, improve the formability and bonding characteristic of a ball portion, improve the bonding strength of wedge connection, and have a superior industrial productivity. A bonding wire mainly composed of copper, and a concentrated layer where the concentration of a conductive metal other than copper is high is formed at a ball bonded portion. The concentrated layer is formed in the vicinity of the ball bonded portion or at the interface thereof. An area where the concentration of the conductive metal is 0.05 to 20 mol % has a thickness greater than or equal to 0.1 μm, and it is preferable that the concentration of the conductive metal in the concentrated layer should be five times as much as the average concentration of the conductive metal at the ball bonded portion other than the concentrated layer.

26 Claims, 1 Drawing Sheet

U.S. PATENT DOCUMENTS

| | | | |
|---|---|---|---|
| 6,894,387 B2 * | 5/2005 | Higashi et al. | 257/738 |
| 7,071,090 B2 * | 7/2006 | Higashi et al. | 438/617 |
| 7,820,913 B2 * | 10/2010 | Uno et al. | 174/94 R |
| 7,969,021 B2 * | 6/2011 | Uno et al. | 257/784 |
| 2004/0245320 A1 * | 12/2004 | Fukagaya et al. | 228/110.1 |
| 2007/0090526 A1 * | 4/2007 | Otsuki | 257/734 |
| 2008/0061440 A1 * | 3/2008 | Uno et al. | 257/762 |
| 2009/0029542 A1 * | 1/2009 | Subido et al. | 438/612 |
| 2009/0085207 A1 * | 4/2009 | Matsunami | 257/738 |
| 2010/0258925 A1 * | 10/2010 | Jeon et al. | 257/676 |

FOREIGN PATENT DOCUMENTS

| | | |
|---|---|---|
| JP | 61099645 | 5/1986 |
| JP | 62097360 | 5/1987 |
| JP | 63024660 | 2/1988 |
| JP | 03054837 | 3/1991 |
| JP | 2004006740 | 1/2004 |
| JP | 2004064033 | 2/2004 |
| JP | 2006190763 | 7/2006 |
| JP | 2006-216929 A | 8/2006 |

OTHER PUBLICATIONS

Devlin P et al., "Copper Ball Bonding for Fine Pitch, High I/O Devices", 38th International Symposium on Microelectronics (2005), p. 320-324.

* cited by examiner

WIRE BONDING STRUCTURE AND METHOD FOR FORMING SAME

This is a U.S. national phase application under U.S.C. §371 of International Patent Application No. PCT/2008/050314, filed Jan. 15, 2008 and claims the benefit of Japanese Application No. 2007-006446, filed Jan. 15, 2007. The International Application was published on Jul. 24, 2008 as International Publication No. WO/2008/087922 under PCT Article 21(2). The contents of the above applications are incorporated herein in their entirety.

TECHNICAL FIELD

The present invention relates to a bonding structure of a bonding wire and a method for forming the same used for wiring an electrode on a semiconductor device to a circuit wiring substrate, such as a lead frame, a substrate, or a tape.

BACKGROUND OF THE INVENTION

Currently, thin wires (bonding wires) having a wire diameter of 20 to 50 μm or so are generally used as bonding wires which bond an electrode on a semiconductor device and an external terminal together. A thermal compression bonding technique with the aid of ultrasound is generally used for bonding a bonding wire, and, a general-purpose bonding device and a capillary jig which allows a bonding wire to pass through the interior thereof for connection are used. The leading end of a wire is heated and melted by arc heating, a ball is formed by surface tension, and then the ball portion is compressingly bonded on the electrode of a semiconductor device heated within a range from 150 to 300° C., and the bonding wire is directly bonded to an external lead by ultrasonic compression bonding.

Recently, technologies related to the structure, material and connection of the semiconductor mounting technologies are rapidly diversified, and for example, in a mounting structure technology, in addition to currently-used QFP (Quad Flat Packaging) using a lead frame, new configurations, such as BGA (Ball Grid Array) using a substrate, a polyimide tape or the like and CSP (Chip Scale Packaging) are practically used, and a bonding wire which has improved loop characteristic, bonding characteristic, mass productivity, usability and the like is demanded. According to such bonding wire connecting technologies, in addition to ball/wedge bonding which is a currently major technique, for wedge/wedge bonding which is suitable for a fine pitch, a bonding wire is directly bonded at two portions, so that improvement of the bonding characteristic of a thin wire is demanded.

Materials which are to be bonded to a bonding wire are also diversified, and for materials of a wiring and an electrode on a silicon substrate, in addition to an Al alloy which is conventionally used, Cu which is more appropriate for fine pattern wiring is practically used. Moreover, an Ag plating, a Pd plating or the like is formed on a lead frame, and a Cu wiring is formed on a resin substrate or a tape, and a film of a noble metal element like gold or a combination of noble metal elements is often formed thereon. Correspondingly to such various kinds of bonding targets, it is demanded to improve the bonding characteristic of a bonding wire and the bonded portion reliability.

As the material of a bonding wire, 4N-group gold having a high purity (purity >99.99 mass %) is used. However, because gold is expensive, a bonding wire of another kind of metal that the material cost is inexpensive is demanded.

In order to meet the demand of a wire bonding technology, it is important to form a ball having a good sphericity when forming the ball, and to achieve a sufficient bonding strength at a bonded portion of the ball portion and an electrode. Moreover, to cope with temperature reduction of a bonding temperature and thinning of a bonding wire, and the like, it is necessary to achieve good bonding strength and tensile strength at a portion where a bonding wire is subjected to wedge bonding to a wiring on a circuit wiring substrate.

In a resin encapsulation step in which a thermal curing epoxy resin having a high viscosity is filled at a fast speed, there is a problem that a bonding wire is deformed and becomes contact to an adjoining wire, and to cope with the advancement of fine pitching, wire elongation, and wire thinning, it is demanded to prevent any deformation of a wire at the time of resin encapsulation as much as possible. Because of the improvement of the strength of a wire, such deformation can be controlled on some level, but practical usage cannot be realized if problems such that loop control becomes difficult and the strength at the time of bonding is reduced are not solved.

As the wire characteristic which satisfies such demand, it is demanded to acquire a comprehensive characteristic such that loop control in a bonding step is easy, the bonding characteristic to an electrode and a lead is improved, and any excessive wire deformation is suppressed in a resin encapsulation step after bonding.

To make the material cost inexpensive, to achieve a superior electrical conductivity, and to improve ball bonding and wedge bonding characteristics, a bonding wire made of copper (hereinafter, copper bonding wire) is developed, and this is disclosed in Unexamined Japanese Patent Application No. S61-99645. According to a copper bonding wire, however, the bonding strength is reduced due to oxidization of the wire surface, and the wire surface is likely to be corroded at the time of resin encapsulation. Those are the reasons that practical usage of a copper bonding wire is not accelerated.

According to copper bonding wires, in order to suppress any oxidization when melting a wire leading end to form a ball, bonding is performed while a nitrogen gas or a hydrogen-containing nitrogen gas is sprayed to the wire leading end. Currently, a nitrogen gas containing 5% of hydrogen is generally used as an atmosphere gas in forming the ball of a copper bonding wire. Unexamined Japanese Patent Application No. S63-244660 discloses a technique of connecting a copper wire to a copper or copper-alloy lead frame under the 5% $H_2+N_2$ atmosphere. Moreover, "Copper Ball Bonding for Fine Pitch, High I/O Devices": P. Devlin, Lee Levine, 38th International Symposium on Microelectronics (2005), P. 320 to 324 discloses that because 5% $H_2+N_2$ gas can suppress any oxidization of a ball surface, such a gas is more desirable than $N_2$ gas.

As a technology of suppressing oxidization of the surface of a copper bonding wire, Unexamined Japanese Patent Application No. S62-97360 discloses a bonding wire that copper is covered with a noble metal or a corrosion-resistant metal, such as gold, silver, platinum, palladium, nickel, cobalt, chrome, titanium, and the like. Moreover, from the standpoint of the ball formability and suppression of deterioration of a plating solution, Unexamined Japanese Patent Application No. 2004-006740 discloses a bonding wire structured as to have a core member mainly composed of copper, a dissimilar metal layer formed on the core member and made of a metal other than copper, and a coating layer formed on the dissimilar metal layer and made of an oxidization-resistant metal having a higher melting point than copper.

In practical usage of copper bonding wires, there are problems such that electrical resistance increases at a bonded portion of a copper bonding wire and an electrode under actual usage environment like high temperature and high humidity, and the bonding strength is reduced so that the long-term reliability is reduced. Such failures often occur when a bonded portion to an Al electrode which is widely used for normal semiconductor devices is encapsulated by a resin. It is expected that a corrosive reaction at a bonded portion of Cu and Al, and generation of a void are the factors of such failures. In the conventional usage environment of an IC, the problem of the bonding reliability of a copper bonding wire is hardly expected, but such a problem should be in consideration for a recent power IC, and a severe environment like an in-vehicle IC. Moreover, according to copper bonding wires, in comparison with conventional gold bonding wires, a wire surface is likely to be oxidized, the failure of the shape of a ball bonded portion and the reduction of the bonding strength are likely to occur.

As means for suppressing any surface oxidization of a copper bonding wire, it is possible to coat the wire surface with a noble metal or an oxidization-resistant metal. In consideration of the need of highly densification, miniaturization and thinning of the semiconductor mounting technology, the inventors of the present invention checked this technology, and confirmed that lots of practical problems have not been solved if a copper bonding wire (hereinafter, multilayer copper wire) having a multilayer structure that the surface of the bonding wire is coated with a metal other than copper is used with a conventional wire bonding technique.

For the conventional copper bonding wire having a monolayer structure (hereinafter, monolayer copper wire), a technology of forming a ball while spraying a ball formation gas to suppress any oxidization of copper, and connecting the ball portion on an electrode. As the ball formation gas, a gas mainly composed of nitrogen is generally used, and nowadays a nitrogen gas containing 5% hydrogen is most popularly used as a standard reference gas. When this bonding technique is applied to a multilayer copper wire, defects relating to the ball bonding characteristic occur. This results in reduction of the usage characteristic of a semiconductor in comparison with a case where a monolayer copper wire or a gold bonding wire which is currently popular is used.

There are practical problems that failures of the shape of a ball bonded portion and reduction of the bonding strength are likely to occur when a ball is formed at the leading end of a multilayer copper wire. As specific defective cases, formation of a flat ball having a poor sphericity, occurrence of misalignment that a ball is so formed as to be inclined relative to a bonding wire, remaining of a wire inside a ball which is not melted, and generation of an air bubble (blow hole) become problems in some cases. When such an abnormal ball is bonded on an electrode, off-centering deformation that a ball is formed but misaligned from the center of a wire, elliptical deformation, petal-like deformation and the like as shape-related failures that the sphericity becomes poor occur. This results in a reason that causes protrusion of a bonded portion from an electrode surface, reduction of the bonding strength, chip damage, and any failures on manufacturing management. Such initial bonding failures may cause reduction of the long-term reliability.

Not only to overcome such problems relating to the bonding characteristic of a ball, but also to practically use a multilayer copper wire which has a little actual usage achievement, the superiority of a performance which can replace a conventional copper bonding wire is needed. For example, it is demanded to improve the bonding strength in wedge bonding, to improve the bonding yield, or to reduce surface oxidization resulting in improvement of the shelf life of a copper bonding wire, more than the case of a monolayer copper wire.

From now, in order to accelerate the practical use of copper bonding wire, it is necessary to sufficiently cope with a thick wire having a diameter of greater than or equal to 50 μm which is not often used for the case of a gold wire for the power IC application, and to cope with a thin wire having a diameter of less than or equal to 20 μm which utilizes the high conductivity of copper, and regarding the characteristics, it is necessary to cope with more difficult demands, such as improvement of the bonding characteristic of a thick wire, small ball bonding with a fine pitch, low temperature bonding, and reverse bonding of a stacked chip connection.

Accordingly, it is an object of the present invention to overcome the problems of the conventional technologies relating to the practical use of the foregoing copper bonding wires, and to provide a bonding structure of a bonding wire which improves the formability and bonding characteristic of a ball portion, the bonding strength in wedge connection, and has a superior industrial productivity, and, a manufacturing method for forming the same.

SUMMARY OF THE INVENTION

A bonding structure of a bonding wire according to an aspect of the present invention is connected to an electrode of a semiconductor device through a ball bonded portion, wherein: the bonding wire mainly composed of copper; and a concentrated layer where a conductive metal other than copper has a high concentration is formed at the ball bonded portion.

In the bonding-wire bonding structure according to another aspect of the present invention, the concentrated layer is formed in the vicinity of a interface of the ball bonded portion.

In the bonding-wire bonding structure according to a further aspect of the present invention, the concentrated layer has an area in which the concentration of the conductive metal is 0.05 to 20 mol % and which has a thickness greater than or equal to 0.1 μm.

In the bonding-wire bonding structure according to an aspect of the present invention, the concentrated layer is formed at the surface of the ball bonded portion.

In the bonding-wire bonding structure according to another aspect of the present invention, an area where the concentration of the conductive metal is 0.05 to 10 mol % has a thickness greater than or equal to 0.1 μm.

In the bonding-wire bonding structure according to a further aspect of the present invention, the concentration of the conductive metal in the concentrated layer is greater than or equal to five times as much as an average concentration of the conductive metal at the ball bonded portion other than the concentrated layer.

In the bonding-wire bonding structure according to an of the present invention, the bonding wire comprises a core member mainly composed of copper and an outer coat layer mainly composed of the conductive metal and covering the core member.

In the bonding-wire bonding structure of the present invention, the conductive metal is palladium or platinum.

In the bonding-wire bonding structure according to another aspect of the present invention, the outer coat layer has a thickness of 0.002 to 0.8 μm.

In the bonding-wire bonding structure according to a further aspect of the present invention, a diffusion layer where copper and the conductive metal have a concentration gradient is formed between the core member and the outer coat layer.

In the bonding-wire bonding structure of the present invention, no air bubble having a diameter greater than or equal to 10 µm is formed inside the ball bonded portion.

In the bonding-wire bonding structure according to an aspect of the present invention, no air-bubble trace having a diameter greater than or equal to 10 µm is formed at the surface of the ball bonded portion.

According to another aspect of the present invention, a method of forming a bonding-wire bonding structure according to any one of the above including a step of melting the leading end of the bonding wire by generating arc discharge between the bonding wire and a discharge torch to form the ball bonded portion.

In the method according to a further aspect of the present invention, the ball bonded portion is formed while maintaining an angle of a wire, interconnecting the leading end of the bonding wire and the leading end of the discharge torch, relative to the lengthwise direction of the bonding wire within 60 degree.

In the method according to an aspect of the present invention, the ball bonded portion is formed while spraying an inert gas or a reducing gas from greater than or equal to two directions or annularly in the vicinity of the leading end of the bonding wire.

In the method according to the present invention, the ball bonded portion is formed under an atmosphere of argon containing 0.02 to 20% of hydrogen.

In the method according to an aspect of the present invention, the ball bonded portion is formed under an atmosphere of nitrogen containing 5 to 50% of argon.

In the method according to another aspect of the present invention, the ball bonded portion is formed under an atmosphere of argon containing 0.02 to 20% of hydrogen.

In the method according to a further aspect of the present invention, the ball bonded portion is formed under an atmosphere of nitrogen containing 5 to 50% of argon.

In the method according to the present invention, the ball bonded portion is formed while spraying an inert gas or a reducing gas in the vicinity of the leading end of the bonding wire at a flow rate of 0.00005 to 0.005 m$^3$/min.

In the bonding-wire bonding structure, at least a part of the concentrated layer formed at the boundary of the ball bonded portion is formed inside either one of the diffusion layer mainly composed of the primary element of the electrode and copper or the intermetallic compound.

In the bonding-wire bonding structure, at least a part of the concentrated layer is formed inside either one of the diffusion layer or the intermetallic compound, and an area where the concentration of the conductive metal is 0.5 to 30 mol % has a thickness greater than or equal to 0.01 µm.

In the bonding-wire bonding structure according to the present invention, the concentrated layer is formed at the boundary of the ball bonded portion after the ball bonded portion is heated for 200 hours at 175° C., and an area where the concentration of the conductive metal is greater than or equal to 1 mol % has a thickness greater than or equal to 0.2 µm.

According to the present invention, it is possible to provide a bonding structure of a bonding wire and a method for forming the same which can cope with thinning of a wire for a fine pitch, and thickening of a wire for the power IC application by improving the bonding reliability under a circumstance of high temperature storing, making the material cost inexpensive in comparison with gold, and improving the ball bonding characteristic and the wire bonding characteristic and the like.

DETAILED DESCRIPTION OF THE INVENTION

Figure 1:
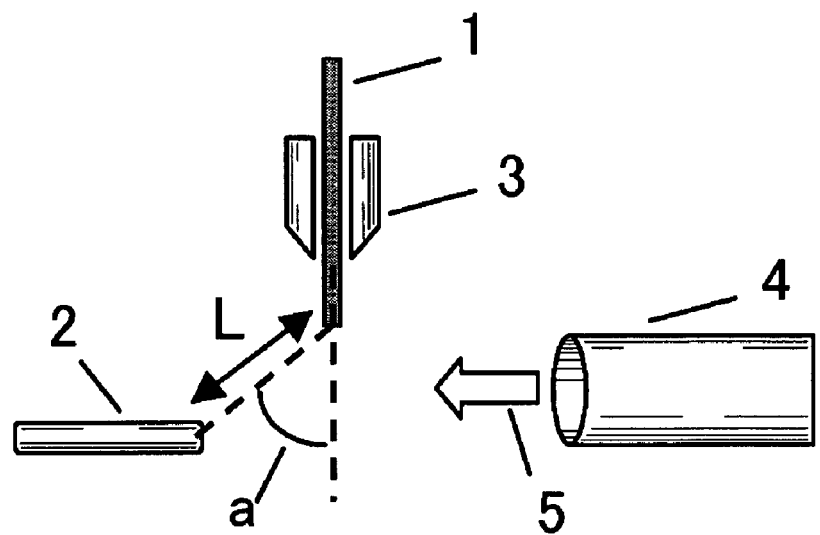
FIG. 1 shows a part of a bonding wire device at a step of forming a ball at the leading end of a bonding wire.

It is found out that forming a concentrated layer of a conductive metal at the interface or the surface of a bonded portion (hereinafter, interface concentrated layer, surface concentrated layer, respectively) is effective as a technique of improving the bonding reliability of a copper-based bonding wire at a high temperature. As an example of the material for forming the concentrated layer, it is confirmed that a copper wire having a multilayer structure (hereinafter, multilayer copper wire) of a core member mainly composed of copper and an outer coat layer containing a conductive material other than copper is effective. It is important to appropriately adjust the composition of the outer coat layer of the multilayer copper wire, the thickness, the multilayer structure, and the like. Further, in order to comprehensively improve the reliability of the multilayer copper wire, it is important to suppress any generation of an air bubble and the trace thereof inside a ball bonded portion and in the surface thereof, and appropriate adjustment of a gas atmosphere, an electrical discharging condition and the like which differ from those of a copper bonding wire with a monolayer structure (hereinafter, monolayer copper wire) which is popularly used in current days. An explanation will be given of the detail of the present invention below.

The concentrated layer means an area having a relatively higher concentration than the concentration of a conductive metal at the center of a ball bonded portion. Preferably, if the concentration of the conductive metal contained in the concentrated layer is greater than or equal to 1.2 times as much as the concentration of the central part of the ball bonded portion, the appropriate characteristic as the concentrated layer can be obtained. More preferably, if the ratio is greater than or equal to twice, the improvement effect by the concentrated layer can be further enhanced. Because the concentrated layer formed at the interface or the surface of a ball bonded portion is often in a form like a layer, it is called a concentrated "layer" in this specification. The form of the concentrated layer is not limited to a form like a successive layer, and includes a case where a part of the concentrated layer is formed discontinuously.

For the bonding structure of a bonding wire mainly composed of copper, it is desirable to form a interface concentrated layer, which is a concentrated layer having a higher concentration of a conductive metal other than copper than other portions, in the vicinity of a interface with an electrode at a ball bonded portion formed by the bonding wire. Here, a interface means the vicinity of a boundary of a ball bonded portion where a ball and an electrode are bonded together. When a bonded portion of a copper bonding wire and an aluminum electrode is heated at a high temperature, a Cu—Al-based intermetallic compound is created at the bonding interface. With the growth of the intermetallic compound, a void is generated, or because of a gas or an ion generated from an encapsulation resin, the intermetallic compound is corroded, resulting in reduction of the reliability. As the interface concentrated layer formed of a conductive metal is formed in the vicinity of the interface where a ball and an electrode are connected together, it is possible to control diffusion of a Cu atom and an Al atom at the bonding interface, an intermetallic compound is grown uniformly across the enter bonding interface, while at the same time, development of corrosion and growth of a void are suppressed, thereby improving the long-term reliability of a bonded portion. Such effects of the interface concentrated layer is not limited to an aluminum electrode, but the same effects of improving the bonding reliability can be achieved for electrode materials of Au, Ag, Pd, Ni, and the like.

It is desirable that the thickness of an area of the interface concentrated layer where the concentration of a conductive metal other than copper is 0.05 to 20 mol % should be greater than or equal to 0.1 µm. This is because if it is less than 0.05 mol %, the effect of improving the reliability is little and if it exceeds 20 mol %, a ball portion may be hardened, resulting in chip damage. Preferably, if it is 0.2 to 10 mol %, a more good effect of improving the long-term reliability can be achieved in a heating test of 150° C. which is a typical temperature of the accelerated heating for semiconductor devices. More preferably, if it is 0.1 to 5 mol %, the initial bonding strength can be improved at a low temperature. This is useful for connection of substrates, such as a BGA, and a CSP. If the thickness of the area within the foregoing concentration range is greater than or equal to 0.1 µm, the foregoing effects can be achieved, and if it is less than 0.1 µm, the improvement effect cannot be obtained stably.

If the thickness of the interface concentrated layer is greater than or equal to 0.2 µm, the effect of improving the long-term reliability can be enhanced, and more preferably, if it is greater than or equal to 0.5 µm, a more good effect of elongating the lifetime of a ball bonded portion at a high temperature can be achieved. The upper limit of the thickness of the interface concentrated layer is less than or equal to 60% of the compression bonding height of a ball bonded portion, and if the upper limit of the thickness of the surface concentrated layer is less than or equal to 40% of the diameter of a ball, a good bonding characteristic can be ensured without deteriorating the bonding characteristic and the like.

At the interface between a ball bonded portion and an electrode, a diffusion layer or an intermetallic compound is often formed because the primary element of the electrode and copper mutually diffuse. Even if a diffusion layer or an intermetallic compound is formed at a ball bonded portion, the effect of improving the bonding reliability at a high temperature can be enhanced by forming a interface concentrated layer. In particular, a bonding structure of a bonding wire that at least a part of a interface concentrated layer formed at the interface of a ball bonded portion is formed inside at least either the diffusion layer, mainly composed of the primary component of an electrode and copper, or the intermetallic compound is desirable. The interface concentrated layer of a conductive metal formed inside the diffusion layer or the intermetallic compound (hereinafter, generally called compound concentrated layer) achieves a function of controlling interdiffusion of copper and the primary component of an electrode at a bonding interface, thereby improving the heat resistance by 10° C. or more in a reliability test. Because of corrosion of an intermetallic compound which is the above-explained failure mechanism, the bonding strength is reduced and a failure that the electrical resistance increases occurs. The compound concentrated layer is effective to extend a failure occurrence time, and it is expected that, as one of the roles, a barrier function of interrupting movement of a gas or an ion generated from a resin to the interface of a ball bonded portion is achieved. When an area where a conductive metal is concentrated in the vicinity of the interface of a bonded portion is limited to a diffusion layer or an intermetallic compound, i.e., in a case where a conductive metal is mainly concentrated at the compound concentrated layer, a sufficient high temperature reliability can be achieved. Further, as a compound concentrated layer concentrated in a diffusion layer or an intermetallic compound is present together with a concentrated layer formed at a copper ball in the vicinity of a bonding interface, the effect of improving the bonding reliability is further enhanced.

Moreover, as at least a part of the concentrated layer is formed inside either a diffusion layer or an intermetallic compound and the thickness of an area where the concentration of the conductive metal is 0.5 to 30 mol % is greater than or equal to 0.01 µm, corrosion of the intermetallic compound by heating is suppressed, thereby achieving an effect of improving the bonding reliability. If the concentration of the conductive metal in the compound concentrated layer is greater than or equal to 0.5 mol %, a sufficient barrier effect suppressing corrosion can be achieved. Conversely, in order to set the concentration of the conductive metal in the compound concentrated layer to be greater than 30 mol %, a special material that the concentration of a conductive metal contained in a copper bonding wire is dramatically increased becomes necessary, and there is often a negative effect that the bonding characteristic is reduced, so that the requisite characteristics for a wire bonding are not satisfied in some cases. Preferably, if the thickness of an area where the foregoing concentration range is from 2 to 20 mol % is greater than or equal to 0.01 µm, the effect of improving the bonding reliability is further enhanced. If the thickness of the area of the foregoing concentration range is greater than or equal to 0.01 µm, the foregoing sufficient effects can be achieved, and if it is less than 0.01 µm, the effect of improving the reliability cannot be achieved stably.

Preferably, if the diffusion layer or the intermetallic layer containing the concentrated layer is formed at a position near a copper ball, an effect of suppressing any damage under an electrode is improved. This is because an adverse effect under an electrode can be reduced if there is the concentrated layer inside the diffusion layer or the intermetallic layer near a copper ball, in comparison with a case where failures, such as a crack due to a difference in thermal expansions or residual strain, and a interface peeling, occur if the diffusion layer or the intermetallic layer formed at a interface on a chip side apart from a copper ball contains the concentrated layer.

The diffusion layer is composed of a disordered alloy mainly containing the primary element of an electrode and copper, and often has a concentration gradient. It is desirable that the concentration of the primary element of an electrode contained in the diffusion layer should be within a range from 1 to 30 mol %. This is because if it is less than 1 mol %, the effect of improving the bonding reliability is little even if the concentrated layer is formed inside the diffusion layer, and if it exceeds 30 mol % and the diffusion layer is formed as a solid solution, the effect becomes unstable. It is desirable that the diffusion layer should have a concentration gradient thereinside. This is because the concentration gradient relieves the concentration of thermal stress, a ball bonded portion can withstand external forces due to thermal expansion of an encapsulation resin or the like, and maintain a sufficient bonding strength. For example, in a case where an electrode is an aluminum alloy (Al—Si, Al—Cu, Al—Si—Cu), it is desirable that the diffusion layer should be a conductive metal of Al and Cu containing 3 to 22 mol % of Al.

The Cu—Al-based diffusion layer containing 2 to 22 mol % of Al can be relatively easily grown, and is stable even if a conductive metal is concentrated, and enhances the effect of improving the bonding reliability.

The intermetallic compound is an ordered alloy mainly composed of the primary element of an electrode and copper, and differs from the diffusion layer that the intermetallic compound has the regularity. Either phase among intermetallic compounds whose presences are known from an equilibrium diagram is nearly always formed at a ball bonded portion. It is categorized to a case where a binary intermetallic compound mainly composed of the primary element of an electrode and copper contains a conductive metal, or to a case where a ternary intermetallic compound of the primary element of an electrode, copper, and a conductive metal is formed, and a good bonding reliability can be obtained in both cases. In particular, if the concentrated layer is formed inside the intermetallic compound, the effect of improving the bonding reliability is enhanced, and more particularly, enhancement of an effect of improving the reliability in a PCT (Pressure Cooker Test), which is a heating condition under a high temperature and high humidity, is achieved, and for example, it is possible to extend the lifetime in the PCT greater than or equal to 1.2 times. The detail of such improvement mechanism is yet unclear, but it is thought that the reliability in the PCT is improved as the concentrated layer formed inside the intermetallic compound suppresses any incursion of water to a ball bonded portion and exerts an effect on the diffusion at the interface and the growth of the intermetallic compound. Moreover, even in a case where the concentrated layer is limited inside the intermetallic compound, a high reliability can be obtained for both of high temperature heating and the PCT.

As a specific example, when an electrode is formed of, for example, an aluminum alloy (Al—Si, Al—Cu, Al—Si—Cu) which is the most popular material, it is desirable that the intermetallic compound phase should be $CuAl_2$, CuAl, or $Cu_9Al_4$ phase for a binary intermetallic compound phase, and by concentrating the conductive metal inside at least any one phase of those intermetallic compounds, the bonding reliability is improved. Moreover, when a ternary intermetallic compound phase of aluminum, copper, and a conductive metal is formed at a ball bonded portion over an aluminum-alloy electrode, by concentrating the conductive metal inside the ternary intermetallic compound phase, the bonding reliability in a PCT or the like is improved. Preferably, if the concentration of the conductive metal is 1 to 20 mol %, an effect of improving the bonding reliability in a PCT is enhanced.

For the technique of analyzing a concentration, a point analysis technique or a line analysis technique using EPMA (Electron Probe Micro Analysis), EDX (Energy Dispersive X-ray analysis), AES (Auger Electron Spectroscopy analysis) or the like at a bonded cross-section can be used. It is desirable to express an analysis area as an average concentration within an area having a diameter of greater than or equal to 0.1 μm, and more preferably, if it is an average concentration in an area greater than or equal to 1 μm, the analysis precision is improved. In a case where, for example, a concentrated position cannot be specified, a line analysis in the vicinity of a bonding interface is desirable. Where the position of a interface concentrated layer is present is obvious, a point analysis is an easy-to-use technique. To evaluate the presence/absence of a concentration through a point analysis, it is desirable to carry out analysis at, at least two points of a concentrated area and an area inside a ball bonded portion and sufficiently apart from a bonding interface.

The point analysis needs to analyze an area sandwiching the vicinity of a bonding interface, and regarding the start point of the point analysis and the end point thereof, explanations will be separately given for a case where a diffusion layer or an intermetallic compound is created and for a case where not created. In a case where a diffusion layer or an intermetallic compound is created, a point analysis is carried out at an area sandwiching all of the diffusion layer and the intermetallic compound, and it is desirable that the start point of such analysis and the end point thereof should be apart from both ends of all of the diffusion layer and the intermetallic compound at least greater than or equal to 2 μm toward a ball and an electrode. Conversely, in a case where the diffusion layer or the intermetallic compound is not created or the presence thereof is unclear, it is desirable that the start point of a point analysis and the end point thereof should be apart from the initial bonding interface of a ball bonded portion at least greater than or equal to 2 μm toward a ball and an electrode. According to such a point analysis technique, it is possible to confirm a concentrated layer formed at the interfacei of a ball bonded portion relatively easily.

Analysis of the interface concentrated layer may be performed on both of a final semiconductor product shipped to the market and a semiconductor embedded in an electronic device and actually used. That is, regarding the concentration or the thickness of a concentrated layer, if it is within the scope of the present invention, when a bonded portion is analyzed, the working and effect can be achieved from both of a semiconductor at the shipping stage or a semiconductor actually in use.

Moreover, by forming a surface concentrated layer on the surface of a ball bonded portion, it is possible to prevent the bonded portion from oxidizing. That is, in a bonding structure of a bonding wire where a bonding wire mainly composed of copper and an electrode is connected, it is desirable to form a surface concentrated layer of a conductive metal other than copper on the surface of a ball bonded potion formed by the bonding wire, and the conductive metal should have a higher concentration than portions other than such a surface. By forming the surface concentrated layer, a protective function of suppressing incursion of oxygen into a copper ball portion after encapsulated by a resin, and of suppressing adsorption of water, and the like begin to work, thereby suppressing growth of an oxidized film or corrosion of copper at the surface of a ball. Moreover, as another practical effect, oxidization of a bonded portion is suppressed even if heating on a high temperature stage and heating at an encapsulation step or a following heat process are applied, so that the bonding reliability is enhanced.

At the surface concentrated layer on the surface of a ball bonded portion, it is desirable that an area in which the concentration of a conductive metal other than copper is 0.05 to 10 mol % should have a thickness greater than or equal to 0.1 μm. If the surface concentrated layer is within such a concentration range, an effect of improving the bonded portion reliability can be sufficiently achieved under a high temperature and high humidity condition like a PCT or the like. This is because if it is less than 0.05 mol %, an effect of suppressing oxidization is insufficient, and if it exceeds 10 mol %, the initial bonding strength with an electrode decreases. Preferably, if it is 0.2 to 4 mol %, petal-like deformation of a ball bonded portion can be suppressed, thereby improving the sphericity. More preferably, if it is 0.3 to 4 mol %, an effect of further improving the reliability under a high temperature and high humidity condition can be enhanced. If the thickness of the area in the foregoing concentration range is greater than or equal to 0.1 μm, it is possible to improve the reliability.

Moreover, if the thickness of the surface concentrated layer is greater than or equal to 0.5 μm, an effect of improving the reliability is enhanced, and more preferably, if it is greater than or equal to 1 μm, a further enhanced effect that oxidization of the surface of a ball is reduced can be achieved.

Confirmation of the surface concentrated layer of a ball bonded portion can be evaluated by analyzing the surface of the ball through EPMA, EDX, Auger spectroscopy analysis, and the like. When there is a concentration distribution at the surface of the ball bonded portion, it is possible to make a determination on the basis of concentrations at greater than or equal to two locations on the surface of the same bonded portion. According to the Auger spectroscopy analysis, performing analysis in the depth direction while sputtering the surface is useful for the evaluation of the film thickness and the foregoing composition.

In the foregoing explanation, the concentration value inside the concentrated layer is utilized, but a ratio of a concentration in a concentrated layer of a conductive metal to be focused relative to a concentration inside a ball becomes an important measure indicating the degree of concentration. That is, it is desirable that a semiconductor device should have a greater than or equal to five times of concentration ratio of the concentration of a conductive metal, other than copper contained in a interface concentrated layer formed in the vicinity of the interface of a ball bonded portion with an electrode or a surface concentrated layer formed on the surface of the ball bonded portion, as much as an average concentration of the conductive metal at portion other than the concentrated layer inside the ball bonded portion. When the concentration ratio is greater than or equal to five times, it is possible to satisfy both of the long-term reliability of the bonded portion and the improvement of the wedge bonding characteristic simultaneously. More preferably, if the concentration ratio is greater than or equal to ten times, an effect of improving the long-term reliability of the bonded portion and reducing the possibility of chip damage can be enhanced. Regarding the surface concentrated layer, concentration measurement of the surface of a ball is carried out, and for a concentration inside the ball, an average value of concentrations measured at greater than or equal to three locations of, for example, the polished cross-section of the ball bonded portion.

As a conductive metal concentrated in a interface concentrated layer or a surface concentrated layer, Pd, Pt, Au, Ag, Rh, P, Sn, and the like are useful. If the conductive metal is such a metal, an effect of improving the reliability without disturbing the growth of an intermetallic compound at the bonded portion can be achieved. More preferably, if the primary element of the concentrated layer is an alloy of at least one of Pd, Pt, and Rh and copper, an improvement effect of improving the bonding reliability becomes remarkable. Further preferably, if the primary element is an alloy of Pd and copper, an effect of improving the long-term reliability under a more severe high temperature condition can be enhanced. As a specific example, if the thickness of a interface concentrated layer where Pd is concentrated in copper is 0.5 μm, the reliability under a heating evaluation of 175° C. which is a severe evaluation for an in-vehicle IC application can be improved.

For a bonding structure having the foregoing interface concentrated layer or surface concentrated layer, both of a ball bonded portion formed by a normal wire bonding technique of forming a loop and a ball bonded portion formed by a stud bump technique can be acceptable. The difference between those is whether or not a loop is formed, but the structure of a ball bonded portion, the reliability required thereto and the like are substantially same.

Regarding the long-term reliability of a bonded portion of a semiconductor, occurrence of a failure is confirmed when the semiconductor is used for a long time, and it is often difficult to find out any failures right after manufacturing. Accordingly, in the reliability test of a semiconductor, it is general to carry out an acceleration evaluation test to shorten the evaluation. More specifically, a high temperature heating test, a high temperature and high humidity test (PCT), a thermal cycle test (TCT) and the like are often carried out, and the required baseline for the reliability is standardized for each test. Semiconductors often have no problem right after manufactured, but any failures are confirmed through a reliability test. Accordingly, an excellence through an acceleration test is often used as a barometer for a determination, and the reliability of a bonded portion can be evaluated after acceleration heating.

A method of checking a bonded portion after an acceleration heating process and observing the interface concentrated layer is further effective and useful. Whether or not a concentrated layer is formed is decided based on a interface structure at a stage merely bonding a bonding wire to an electrode, and the role of an acceleration heating process after that is merely to improve the efficiency and accuracy of an observation by thickening the interface concentrated layer. According to a method of observing a interface concentrated layer after an acceleration heating process, evaluation and analysis of the interface concentrated layer are facilitated.

It is desirable that a bonding structure of a bonding wire should have a concentrated layer formed at the interface of a ball bonded portion after heating a ball bonded portion for 200 hours at a temperature of 175° C. as an area where the concentration of a conductive metal is greater than or equal to 1 mol % having a thickness of greater than or equal to 0.2 μm. By heating at a temperature of 175° C. for 200 hours, the concentrated layer is thickened, if it is greater than or equal to 1 mol %, the measurement of concentration becomes relatively easy, and if the thickness of an area greater than or equal to 1 mol % is greater than or equal to 0.2 μm, a good bonding reliability can be achieved. The bonded portion of a bonding wire has an area, in which the concentration of a conductive metal is 0.05 to 20 mol %, having a thickness of greater than or equal to 0.1 μm as explained above, and it is thought that the bonded portion of the bonding wire corresponds to a concentrated layer observed when heated at 175° C. for 200 hours.

The purpose of an acceleration heating process is to thicken a interface concentrated layer, and a heating temperature and a time are not limited to the foregoing ones. Because a concentrated layer is diffusion-controlled, the thickness of the concentrated layer is proportional to the square root of a heating time, and it is possible to calculate the thickness of the concentrated layer even if a heating time changes. For example, when the foregoing heating time becomes 400 hours which is twice as much as before, it is desirable that the thickness of the concentrated layer should be $2^{1/2}$ times, and should be greater than or equal to 0.28 μm. Moreover, there is an advantage of shortening an evaluation time by increasing the heating temperature, so that heating at 250° C. is effective. In converting the relationship between the foregoing heating condition and a diffusion layer by a temperature of 200° C., it is confirmed that the thickness of an area where the concentration of a conductive metal is 2 mol % is replaced with greater than or equal to 0.4 μm after heated for 100 hours at 200° C.

As a material forming the foregoing concentrated layer, it is desirable that connection should be established by a multilayer copper wire having a core member mainly composed of copper and an outer coat layer mainly composed of a conductive metal other than the element of the core member. According to a monolayer copper wire having undergone alloying by adding a conductive metal, the bonding reliability can be enhanced, but by further using a multilayer copper wire, the effect of improving the bonding reliability is further enhanced, and an effect of suppressing any oxidization of the surface of a wire can also be achieved. In order to form the foregoing interface concentrated layer or surface concentrated layer using a monolayer copper wire, if the additive concentration of an alloy element in the wire is increased, then a ball portion is hardened, thereby often causing a chip damage when bonding. On the other hand, according to a multilayer copper wire, by appropriately adjusting the thickness of the outer coat layer, the composition, the structure and the like, there is an advantage of comprehensively improving the bonding wire characteristic.

If a conductive metal forming the outer coat layer is mainly composed of a noble metal element like Au, Pt, Pd, and Rh, an effect of suppressing any oxidization of the surface of a wire can be achieved. Because the comprehensive characteristic, such as the bonding characteristic and a loop shape is improved, when the characteristic of the bonding wire in use is comprehensively evaluated, it is confirmed that if the conductive metal constituting the outer coat layer is at least any one of Pd or Pt among the foregoing metals, this will be an advantage for the improvement of the characteristic.

By using a bonding wire having the outer coat layer mainly composed of a conductive metal of at least any one of Pd, Pt, a remarkable effect of improving the bonding reliability is achieved, while at the same time, the ball bonding characteristic, the wedge bonding characteristic, extension of the lifetime of the bonding wire and the like can be comprehensively satisfied. That is, it is desirable that a semiconductor device should have a bonded potion having a interface concentrated layer at a bonding interface or a surface concentrated layer at the surface of a ball, with a bonding wire having a core member mainly composed of copper and an outer coat layer formed thereon and mainly composed of at least any one of Pd, Pt. Here, the words mainly composed of means a case where a concentration is greater than or equal to 20 mol %. More preferably, Pd rather than Pt can achieve a better wedge bonding characteristic, and the initial bonding strength of a wedge bonded portion can be increased 1.5 to 3 times as much as that of a monolayer copper wire.

Preferably, if the concentration of a conductive metal other than copper at the surface of the outer coat layer is greater than or equal to 30 mol %, electrical discharge when a ball is formed in mass production becomes stable, thereby improving the sphericity of an initial ball. More preferably, if it is greater than or equal to 60 mol %, it is confirmed that the concavities and convexities at the surface of an initial ball can be reduced, and a flat surface characteristic can be achieved.

It is preferable that the thickness of the outer coat layer should be within a range from 0.002 to 0.8 μm, and this is because a good wedge bonding characteristic can be achieved and a ball bonding characteristic can be improved. If the thickness is less than 0.002 μm, effects of suppressing any oxidization of a copper bonding wire and of improving the bonding characteristic than a monolayer copper wire cannot be achieved, and it is difficult to control the film thickness precisely since it is too thin, and if it exceeds 0.8 μm, a ball portion is hardened, and this may result in any chip damage. More preferably, if the thickness of the outer coat layer is within a range from 0.01 to 0.5 μm, an effect of improving the wedge bonding characteristic is enhanced, and an effect of extending the capillary lifetime can also be achieved due to reduction of wire grinding or the like. Further preferably, if the thickness of the outer coat layer is within a range from 0.01 to 0.2 μm, an effect of reducing any chip damage at a ball bonded portion can be further enhanced while improving the wedge bonding characteristic. Such a relevance between the film thickness and the characteristic thereof becomes more apparent when the conductive metal constituting the outer coat layer is at least any one of Pd, Pt.

By forming a diffusion layer having a concentration gradient between a core member and an outer coat layer, an effect of improving both loop control characteristic and wedge bonding characteristic simultaneously, which are difficult to be achieved at the same time, can be expected. That is, it is desirable that a semiconductor device should have a bonded portion having a interface concentrated layer at a interface or a surface concentrated layer at the surface of a ball, using a bonding wire having a core member mainly composed of copper, an outer coat layer composed of a conductive metal which is at least any one of Pd, Pt and a diffusion layer in which at least one of Pd and Pt and copper have a concentration gradient and which is formed between the core member and the outer coat layer.

It is effective if the outer coat layer is composed of an alloy containing copper and a conductive metal and the outer coat layer contains a diffusion layer that a conductive metal and copper have a concentration gradient inside the outer coat layer. That is, inside the outer coat layer, it is desirable that a bonding wire should have a diffusion layer having a concentration gradient of a conductive metal and copper in a wire radial direction and having a thickness of 0.001 to 0.5 μm. By having a concentration gradient, the adhesion of the outer coat layer to the core member and the controllability when forming a loop subjected to complex plastic deformation can be improved simultaneously in comparison with a case where a conductive metal has a uniform concentration across the entire outer coat layer.

As the diffusion layer reaches the surface so that the outer coat layer is entirely formed of the diffusion layer, an effect of suppressing any variation of loops can be further enhanced. Forming the diffusion layer to the surface is effective for adjusting the foregoing Pd concentration at the surface of the outer coat layer.

Regarding the concentration gradient inside the outer coat layer, it is desirable that the amount of change in concentration should be greater than or equal to 10 mol % per 1 μm, in the depth direction. Preferably, if it is greater than or equal to 10 mol % per 0.1 μm, a good effect of mutually utilizing both characteristics of the outer coat layer and the core member can be expected without detracting both characteristics. Regarding a boundary between the outer coat layer having a concentration gradient and the core member, it is desirable to make a portion, corresponding to an intermediate concentration in the differences of concentration values at both ends of the concentration gradient, as a boundary.

The area of the concentration gradient of the conductive metal is not limited to the entire outer coat layer, but may be a part thereof. In a case where a plurality of conductive metals are contained, if at least one of the conductive metals has a concentration gradient, characteristics, such as the bonding characteristic and the loop controllability, can be improved, and as the behavior of the concentration gradient differs due to the different conductive metals contained, the characteristics can be further improved in some cases in comparison with a single conductive metal.

If the concentration gradient has a tendency of decreasing the concentration from the surface toward the depth direction, it is advantageous to improve the adhesiveness of the outer coat layer to the core member. Regarding a method of forming such a concentration gradient, it is desirable that an area should be formed by diffusing a conductive metal and a copper element. This is because if a layer is formed by diffusion, there is little possibility that failures, such as local abrasion and crack occur, and there is an advantageous that formation of successive change in concentration is easy.

From the standpoint of productivity and quality stability, it is desirable that the concentration gradient inside the outer coat layer should successively change. That is, it is not always necessary that the degree of the gradient of the concentration gradient is constant in the outer coat layer, and can change successively. For example, even if the gradient of the concentration gradient at a interface between the outer coat layer and the core member or in the vicinity of the most outward surface may differ from the gradient inside the outer coat layer, and the concentration changes like an exponential function, a good characteristic can be achieved.

Regarding the analysis of the concentration in the outer coat layer, a technique of analyzing the concentration while digging down from the surface of a bonding wire in the depth direction by sputtering, or, a line analysis or a point analysis at a wire cross-section are effective. The former technique is useful when the outer coat layer is thin, but it takes a long time for measurement if the outer coat layer is too thick. The latter analysis at a cross-section is useful when the outer coat layer is thick, and it is relatively easy to check the concentration distribution across the entire cross-section and the reproducibility at several locations, but the accuracy decreases if the outer coat layer is thin. It is possible to carry out measurement by polishing a bonding wire obliquely, and by enlarging the thickness of a diffusion layer. For a cross-section, a line analysis is relatively easy, but if improvement of the accuracy of analysis is needed, it is also effective to shorten the analysis interval of a line analysis, or to carry out a point analysis only for focusing on an area where observation is desired in the vicinity of a interface. Analysis devices used for such concentration analysis can utilize EPMA, EDX, Auger electron spectroscopy analysis, a transmission electron microscope (TEM) and the like can be used. For researching an average composition, it is possible to utilize a technique of, for example, dissolving a bonding wire from a surface portion step by step by an acid or the like, and of acquiring the composition of the dissolved portion on the basis of a concentration contained in the solvent.

In order to manufacture a bonding wire of the present invention, it is necessary to have a step of forming a core member and an outer coat layer, and a heating process of forming the concentration gradient of a copper element inside the outer coat layer and of exposing it at the most outward surface.

For forming the outer coat layer on the surface of the copper-made core member, a plating technique, a vapor deposition technique, a melting technique and the like can be utilized. For the plating technique, a bonding wire can be manufactured through both electrolytic plating and electroless plating. According to electrolytic plating called strike plating or flash plating, a plating speed is fast and the adhesiveness to a base member is good. Solutions used in electroless plating are divided into a replacement type and a reduction type, and if a film thickness is thin, merely replacement type plating is sufficient, but if a thick film is to be formed, it is effective to perform reduction type plating step by step after replacement type plating. Regarding the electroless plating, a device or the like can be simple, and it is easy to carry out, but it takes a longer time than electrolytic plating.

For the vapor deposition technique, physical adsorption, such as sputtering, ion plating and vacuum deposition, and chemical adsorption like plasma CVD can be utilized. All techniques are dry systems, and rinsing after a film is formed is unnecessary, so that it is not necessary to consider surface contamination through rinsing.

At a step of performing plating or vapor deposition, both of a technique of forming the film of a conductive metal at a target wire diameter and a technique of forming a film on a core member having a thick diameter, and then performing wire drawing plural times, until a target wire diameter is obtained are useful. Regarding the former film formation at a final diameter, manufacturing and quality control are easy, and regarding the latter combination technique of film formation and wire drawing, it is advantageous to improve the adhesiveness of a film to the core member. Specific examples of the respective formation techniques are a technique of forming a film while successively sweeping a wire into an electrolytic plating solution, or a technique of forming a film while soaking a thick copper wire in an electrolytic or electroless plating solution, and of drawing the wire until a final target diameter is obtained.

As a step of forming the concentration gradient of copper inside the outer coat layer and of exposing copper at the most outward surface using the outer coat layer and the core member formed through the foregoing technique, a diffusion heat treatment by heating is effective. This is a heating treatment of promoting interdiffusion of copper and the conductive metal at a interface between the outer coat layer and the core member. A technique of performing a heat treatment while successively sweeping a wire results in the superior productivity and quality stability. However, by merely heating a wire, it is not possible to control the distribution of copper at the surface of the outer coat layer and the interior thereof. If annealing for removing any process strain used in a normal wire manufacturing is directly applied, it is difficult to completely overcome problems such that loop control becomes difficult due to reduction of the adhesiveness of the outer coat layer to the core member, wire cutting scraps, wire scraping dust), or deposits inside a capillary and clogging is caused, and copper exposed at the surface is oxidized so that the bonding strength is reduced. Therefore, it is important to control the temperature, speed, time and the like of a heating treatment.

An example of a preferred heat treatment is to perform a heat treatment while successively sweeping a wire, and to have a temperature gradient in a furnace, not to set a temperature inside the furnace to be constant as a general heat treatment, and such heat treatment facilitates mass production of a bonding wire having an outer coat layer and a core member that is a characteristic of the present invention. In a specific example, a technique of locally introducing a temperature gradient and a technique of changing a temperature inside the furnace are possible. To suppress any oxidization of the surface of a bonding wire, it is effective to perform heat treatment while introducing inert gases, such as $N_2$ and Ar.

It is desirable to perform a heat treatment having such a temperature gradient or a temperature distribution at a final target wire diameter from the standpoint of productivity, but on the other hand, by performing wire drawing after the heat treatment, it is possible to remove an oxidized film on the surface, thereby improving the bonding characteristic, and by combining wire drawing and strain-removing annealing, the amount of wire scraps and dust inside a capillary can be reduced.

The melting technique is a technique of melting either the outer coat layer or the core member, and of performing casting, and by connecting a coat layer and a core member using a wire having a thick diameter of 1 to 50 mm and then drawing the wire, the productivity is improved, and there are advantageous that alloy component designing is easy in comparison with plating and vapor deposition, and improvement of characteristics, such as the strength and the bonding characteristic, are easily achieved. As a specific step, it is divided into a technique of casting a melted conductive metal around a core member produced beforehand to form an outer coat layer, and a technique of using a hollow cylinder of a conductive metal prepared beforehand, and of casting melted copper or a copper alloy into the center of the hollow cylinder to form a core member. Preferably, the technique of casting a copper core member into the hollow cylinder facilitates formation of the concentration gradient of copper inside the outer coat layer stably. If a little amount of copper is contained in the outer coat layer formed beforehand, controlling of the copper concentration at the surface of the outer coat layer becomes easy. According to the melting technique, it is possible to skip a heating work to diffuse Cu in the outer coat layer, but by performing heat treatment to adjust the distribution of CU inside the outer coat layer, further improvement of the characteristic can be expected.

Further, when using a melted metal, it is possible to manufacture at least either one of the core wire and the outer coat layer by successive casting. According to such a successive casting, the manufacturing steps are simplified in comparison with the foregoing casting technique, and a wire diameter can be thinned, thereby improving the productivity.

As a technique of forming a bonding structure of a bonding wire having at least a part of a interface concentrated layer formed at the boundary of a ball bonded portion inside at least a diffusion layer mainly composed of the primary element of an electrode and copper or an intermetallic compound, it is effective to establish a connection using a multilayer copper wire having a core member mainly composed of copper and an outer coat layer mainly composed of a conductive metal. If a bonding wire is the multilayer copper wire, by adjusting the constituting element, thickness, concentration gradient, composition and the like of the outer coat layer, it becomes easy to control the distribution thickness of a concentrated layer at a bonding interface. For example, to form a interface concentrated layer inside an intermetallic compound, increasing the thickness of the outer coat layer, increasing the ratio of the conductive metal, and controlling the composition of the diffusion layer formed at the interface between the outer coat layer and the core member are often effective. Moreover, as a connection technique of promoting formation of the interface concentrated layer inside the intermetallic compound, it is effective to use a nitrogen gas as an atmosphere gas in formation a ball. It is expected that suppressing any oxidization of the surface of a ball and promoting segregation of a conductive metal to the surface of the ball in arc discharge result in promotion of formation of the concentrated layer inside the intermetallic compound growing at a bonded portion.

By examining the bonding reliability of a multilayer copper wire further carefully, it is confirmed that as problems to be solved, off-centering deformation of a ball bonded portion is likely to occur and an air bubble or the trace thereof are formed, and it is found out that different improvement techniques are effective for individual failures. It is found out that for reduction of off-centering deformation, setting the discharge condition appropriately is effective, and to suppress any generation of air bubbles or the traces thereof at a bonded portion, selection of an atmosphere gas in forming a ball is effective. The respective failure phenomenon and improvement techniques will be discussed later. In either case, the improvement effect can be perceived using a monolayer copper wire, but in particular, the working and effect are enhanced using a multilayer copper wire.

In a technique of forming a bonding structure of a bonding wire, it is desirable that an angle between the leading end of a bonding wire and the reading end a discharge torch should be within 60 degree from a wire lengthwise direction, and a ball portion should be formed by creating arc discharge between the discharge torch and the leading end of the wire. FIG. 1 shows a part of a wire bonding device in a step of forming a ball, and arch discharge is generated between a wire 1 and a discharge torch 2, and the leading end of the wire is melted, thereby forming a ball. In order to suppress any oxidization of copper when melted, an inert gas or a reducing gas is sprayed in a direction of an arrow from a gas nozzle 4, thereby forming a gas atmosphere around the wire 1 and the discharge torch 2. The foregoing angle corresponds to an angle a in FIG. 1, and is an angle (hereinafter, torch angle) between a straight line interconnecting the leading end of the wire 1 and the leading end of the discharge torch 2 and a wire lengthwise direction.

To suppress off-centering of a ball bonded portion, it is necessary to reduce misalignment failure that a ball is formed obliquely relative to a bonding wire. To reduce misalignment failure, it is found out that an incidence angle of arc discharge relative to the lengthwise direction of a bonding wire is important, and this is controlled by a positional relationship between the bonding wire and the discharge torch. If the torch angle a exceeds 60 degree, discharge is generated only at one side of the bonding wire, so that misalignment occurs. More preferably, if such an angle is within 40 degree, the incidence rate of off-centering of a bonded portion can be further reduced. Further preferably, if a distance L between the leading end of the bonding wire and the leading end of the discharge torch is within a range from 0.5 to 2.5 mm, a good effect of improving misalignment can be achieved, thereby ensuring the mass-productivity stably. If the distance L is less than 0.5 mm, a capillary may contact the discharge torch when descending, and if it exceeds 2.5 mm, arch discharge becomes unstable, so that the ball sizes are likely to vary.

Figure 2:
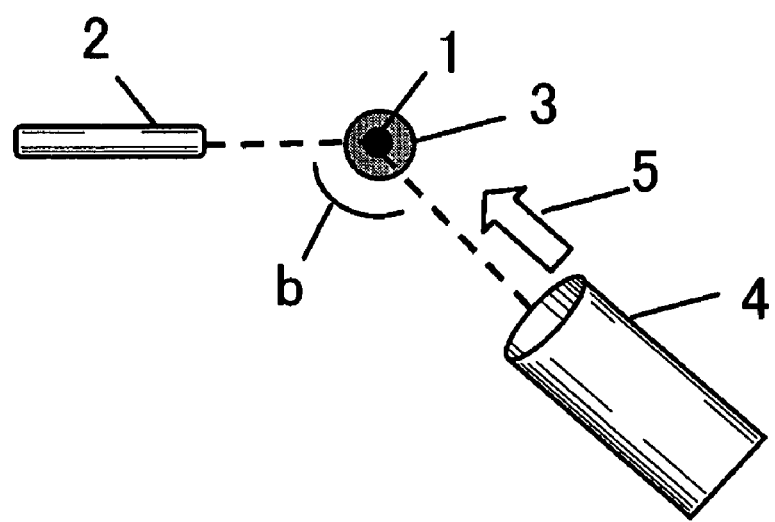
FIG. 2 is a projection drawing of the bonding wire device as viewed from the above at the step of forming a ball at the leading end of a bonding wire.

To suppress any off-centering failures when forming a tiny ball, a positional relationship between a direction of arc discharge relative to a bonding wire and a direction in which a gas is sprayed is effective to suppress any misalignment. More specifically, in a project plane from the above of the bonding wire device, it is desirable that an angle (hereinafter, gas spraying angle) between a line interconnecting the leading end of a wire and the leading end of the discharge torch and a line interconnecting the leading end of the wire and the leading end of a gas pipe should be within a range from 40 to 150 degree. With reference to FIG. 2 showing a project plane from the above of the device, the wire 1 is shown by a point, and an angle b between a line interconnecting the wire 1 and the leading end of the discharge torch 2 and a line interconnecting the wire 1 and a shielding gas pipe 4 corresponds to the gas spraying angle. In a case where there are greater than or equal to two shielding gas pipes, even one pipe satisfies the gas spraying angle, the expected effect can be achieved. If the gas spraying angle is within the range from 40 to 150 degree, even if a tiny ball having a ratio of ball diameter less than or equal to, for example, 1.5 times as much as a wire diameter is formed, generation of misaligned ball is reduced, resulting in enhancement of an effect of suppressing any misalignment at a bonded portion. If the foregoing angle is less than 40 degree, oxidization of the surface of a ball becomes a problem, and if it exceeds 150 degree, the sphericity may decrease. Preferably, if it is within a range from 60 to 130 degree, a good effect of suppressing any misalignment and off-centering can be achieved.

Further preferably, it is desirable that in a method of connecting a bonding wire having a core member mainly composed of copper and an outer coat layer mainly composed of a conductive metal different from the component of the core member and formed on the core member, an angle (gas spraying angle) between a line interconnecting the leading end of a wire and the leading end of a discharge torch and a line interconnecting the leading end of the wire and a shielding gas pipe should be in a range within 45 to 150 degree in a project plane from the above of a bonding wire device. Regarding the effect of such a gas spraying angle, an enormous effect can be achieved for a multilayer copper wire that the frequency of occurrence of off-centering becomes large, rather than a monolayer copper wire.

To improve the size stability of a formed tiny ball, it is desirable to bond a formed ball while spraying an inert gas or a reducing gas to the leading end of a wire from greater than or equal to two directions or annularly. As the gas is sprayed from greater than or equal to two directions or gas spray nozzles are disposed annularly so as to surround the leading end of the wire, the directionality of discharging is stabilized, so that an effect of suppressing any variation in initial ball diameters can be enhanced. When forming a tiny ball having a ball diameter ratio to a wire diameter less than or equal to 1.5 times, it is difficult in some cases to form a stable ball by spraying from one direction, but according to spraying from greater than or equal to two directions or in an annular manner, a ball diameter becomes stable. More preferably, if an angle of a spraying direction in a case of two-direction spraying is within a range from 40 to 180 degree, a good effect of stabilizing the size, sphericity and the like of a tiny ball can be achieved.

The improvement effects due to a positional relationship between a bonding wire and a discharge torch, a gas spraying direction and the like which are techniques of suppressing any off-centering can be achieved effectively by any kinds of gases. More specifically, the same effect can be achieved by a nitrogen gas, a mixed gas of hydrogen and nitrogen, an Ar gas, a mixed gas of hydrogen and Ar, and the like, and for example, it is confirmed that a sufficient effect can be achieved by a mixed gas of 5% hydrogen and nitrogen.

Regarding the atmosphere of an inert gas or a reducing gas in forming a ball, it is desirable to melt a bonding wire to form a ball while spraying a gas to the vicinity of the leading end of a wire at a flow rate of 0.00005 to 0.005 m$^3$/min. It is necessary to keep the foregoing gas atmosphere while the leading end of the wire is melted and solidifies, and by spraying a gas at the flow rate of 0.00005 to 0.005 m$^3$/min, a stable successive bonding characteristic in mass production can be ensured. Here, if the gas flow rate is less than 0.00005 m$^3$/min, room air may be mixed and non-bonded portions may be generated in successive ball bonding, and in a case of a fast flow rate greater than or equal to 0.005 m$^3$/min, a ball may not be formed or an extremely tiny ball may be formed due to arc interruption or the like. More preferably, if the flow rate is within a range from 0.0001 to 0.002 m$^3$/min, it is effective to improve the yield of successive bonding characteristic at a normal initial ball diameter. Further preferably, if it is within a range from 0.0001 to 0.001 m$^3$/min, variation in ball diameters can be reduced, so that a good effect of stabilizing the size of a ball bonded portion can be achieved.

If an air-bubble trace is formed at the surface of a ball bonded portion or if an air bubble is formed inside a ball, a ball shape failure occurs or the bonding strength is reduced as a result. Suppression of air bubbles and air-bubble traces is effective to improve the bonding reliability of a multilayer copper wire. According to a multilayer copper wire, in comparison with conventional monolayer copper wires, the frequency of occurrence of failures, such as air bubbles and air-bubble traces, in forming a ball greatly increases. Since copper which is a primary element of the core member and a conductive metal which is a primary element of an outer coat layer have different characteristics, such as melting points, melting heats, oxidization characteristics and wettabilities, it is thought that such differences intricately affect expansion of arch discharge, a melting condition, a solidification behavior, and alloying of both metals when a multilayer copper wire is melted, so that ball formation behavior dramatically differs from a monolayer copper wire, thereby generating air bubbles and air-bubble traces.

It is desirable that a semiconductor device should have a bonded portion which has no air-bubble trace greater than or equal to 10 μm at the surface of the ball bonded portion of a multilayer copper wire, or no air bubble greater than or equal to 10 μm inside a ball bonded portion. If the air-bubble trace at the surface of the ball bonded portion is greater than or equal to 10 μm, the ball shape becomes poor, and the air-bubble trace reduces the adhesiveness of the ball to a resin when the ball is encapsulated by the resin. Moreover, if the air bubble inside the ball bonded portion is greater than or equal to 10 μm, the bonding strength with an electrode material is reduced, so that the long-term reliability in operating as an IC is reduced. Preferably, if it is possible to maintain the size of the air bubble or air-bubble trace less than or equal to 6 μm, the improvement effects for the respective reliabilities can be further enhanced.

Regarding evaluation of an air-bubble trace, it is possible to confirm by observing a ball bonded portion using an optical microscope or an SEM (Scanning Electron Microscope) and the like, and regarding evaluation of an air bubble, it is possible to confirm by polishing the cross-section of a ball bonded portion cut in a vertical or horizontal direction to a chip or an electrode surface and observing it using an optical microscope or an SEM. It is preferable to observe greater than or equal to fifty bonded portions, and to evaluate any air bubbles and air-bubble traces.

To suppress any generation of an air bubble or an air-bubble trace at a bonded portion, it is found out that adjusting an atmosphere gas in forming a ball appropriately is effective. That is, it is desirable that a wire bonding method should bond a ball portion formed by melting the leading end of a multilayer copper wire under the atmosphere of an Ar gas containing hydrogen within a range from 0.02 to 20%.

By using an Ar gas containing hydrogen within a range from 0.02 to 20%, arc discharge is stabilized, and negative affects by the gas are also suppressed, the sphericity of a ball becomes good, generation of any air bubbles inside the ball or air-bubble trace at the surface of a ball bonded portion is suppressed, thereby achieving good ball bonding shape and bonding strength like a monolayer copper wire and a gold wire. It is thought that hydrogen effectively affects stabilization of arch discharging and suppression of any oxidization. When a ball is formed in a mixed gas of hydrogen and nitrogen often used for monolayer copper wires, air bubbles inside a ball and air-bubble traces at the surface of a ball bonded portion are generated, resulting in ball shape failures and reduction of bonding strength. Regarding the working and effect of hydrogen and an Ar gas, such effect can be achieved in a case of a monolayer copper wire, but can be further enhanced in a case of a multilayer copper wire. The reason of the foregoing range of the hydrogen concentration is based on the fact that if it is less than 0.02%, an effect of suppressing any generation of air bubbles and air-bubble traces is insufficient, and if it exceeds 20%, there are problems such that ball diameters vary and the diameters of ball bonded portions vary. More preferably, if the hydrogen concentration is within a range from 0.1 to 10%, an effect of causing air bubbles generated inside an initial ball to be small and of causing air bubbles generated inside a ball bonded portion to be small is enhanced. Further preferably, if the hydrogen concentration is within a range from 0.3 to 5%, an effect of suppressing any generation of air bubbles and air-bubble traces is further improved, and it is observed that generation of air bubbles and air-bubble traces are reduced even for initial balls before bonding. A wire structure is deeply related to selection of an atmosphere gas for forming a ball, and a mixed gas of hydrogen and Ar is sometimes inappropriate for a monolayer copper wire, but is very effective to a multilayer copper wire.

It is confirmed that a mixed gas of hydrogen and Ar is the most effective gas for suppressing any air bubbles and air-bubble traces of a multilayer copper wire. Regarding the gas flow rate, because the same effect can be achieved, it is desirable to melt a bonding wire to form a ball while spraying an Ar gas containing hydrogen within a range from 0.02 to 20% to the vicinity of the leading end of the wire at a flow speed of 0.00005 to 0.005 m$^3$/min. Regarding a gas spraying direction, it is necessary to spray the gas from at least one direction. According to a method of spraying the gas from greater than or equal to two directions or annularly, the shielding effect is enhanced, so that mass-production stability is improved, and it is possible to reduce the gas flow rate for cost reduction. Note that the foregoing gas flow rate corresponds to a total gas flow rate when the gas is sprayed from greater than or equal to two directions.

It is confirmed that a mixed gas of Ar and nitrogen is effective to suppress any air-bubble traces in the vicinity of the surface of a ball bonded portion and to stabilize a bonding shape. That is, it is desirable that a wire bonding method should bond a ball formed by melting the leading end of a copper bonding wire under the atmosphere of a nitrogen gas containing Ar within a range from 5 to 50%. Air bubbles are formed as a gas component dissolved at the time of melting a ball is not emitted and remains when the ball is solidified, but it is thought that the mixed gas of Ar and nitrogen promotes gas discharge when the ball is solidified. Regarding the working and effect of the foregoing mixed gas of Ar and nitrogen, such an effect can be achieved in a case of monolayer copper wires, but can be further enhanced in a case of monolayer copper wires. Regarding the elliptical deformation of a ball bonded portion that is often a problem of multilayer copper wires, it is confirmed that there is a tendency to deform slightly elliptically in a case of pure Ar and pure nitrogen, and the frequency of occurrence is reduced but cannot be completely suppressed in a case of a mixed gas of hydrogen and Ar, but it is confirmed that in a case of a mixed gas of Ar and nitrogen, a good effect of suppressing any elliptical deformation is achieved. Regarding the Ar concentration, it is confirmed that if it is less than 5%, the improvement effect is insufficient, and if it exceeds 50%, the ball size becomes unstable. Regarding the flow rate and the spraying method, it is confirmed that the same effect is achieved under the foregoing conditions.

According to a wire bonding method of generating arc discharge between a discharge torch and the leading end of wire to form a ball under an Ar gas containing hydrogen within a range from 0.02 to 20% with a condition that an angle between the leading end of the copper bonding wire and the leading end of the discharge torch is within 60 degree from the wire lengthwise direction, a good effect of suppressing any misalignment and of suppressing any air bubbles simultaneously can be achieved. It is found out that by examining a combination of a gas and a bonding wire carefully, misalignment can be suppressed if the torch angle is adjusted within the foregoing range even though a mixed gas of hydrogen and Ar has effects of inducing misalignment of an initial ball of a multilayer copper wire and off-centering failure of a bonded portion.

More preferably, it is desirable that a method of connecting a bonding wire having a core member mainly composed of copper and an outer coat layer mainly composed of a conductive metal other than the primary element of the core member and formed on the core member should bond a ball bonded portion formed by melting the leading end of the bonding wire under an Ar gas containing hydrogen within a range from 0.02 to 20%, wherein an angle between the leading end of the bonding wire and the leading end of a discharge torch is within 60 degree from the wire lengthwise direction. Regarding such a torch angle effect, a good effect can be achieved in a case of multilayer copper wires rather than a case of monolayer copper wires. This is because according to the monolayer copper wires, the original frequency of occurrence of misalignment is relatively small, and the effect can be achieved by adjusting a discharge current and a discharge time, and the like. According to the multilayer copper wires, the film thickness, component of an outer coat layer are not always uniform in a wire cross-section, thereby causing misalignment. In a case where such a non-uniform outer coat layer is formed, by adjusting the torch angle within the foregoing range, a good effect of stabilizing wire melting and ball formation can be achieved. Further, when a ball is formed using a multilayer copper wire with a mixed gas of hydrogen and Ar, the improvement effect of the torch angle is dramatically enhanced.

According to a wire bonding method of generating arc discharge between a discharge torch and the leading end of a wire to form a ball portion under an $N_2$ gas containing Ar within a range from 5 to 50% with a condition that an angle between the leading end of the copper bonding wire and the leading end of the discharge torch is within 60 degree, a good effect of suppressing any misalignment and suppressing any air-bubble traces at the surface of a bonded portion simultaneously can be achieved.

According to a wire bonding method of generating arc discharge between a discharge torch and the leading end of a wire to form a ball in an atmosphere of a nitrogen gas containing hydrogen within a range from 0.02 to 20%, wherein an angle between the leading end of the copper bonding wire and the leading end of the discharge torch is within 60 degree from the lengthwise direction of the wire, in addition to suppressing any off-centering, it is possible to achieve a good effect of satisfying stabilization of both size and sphericity of a ball bonded portion.

EXAMPLES

Hereinafter, examples will be explained.

As a raw material of a bonding wire, a copper material having a high purity greater than or equal to about 99.99 mass % was prepared, and as Pt, Pd, Au, Rh materials of an outer coat layer, a raw material having a purity of 99.99 mass % were prepared. Regarding a monolayer copper wire, a predetermined alloy element was added and melted to produce an ingot. Regarding production of a multilayer copper wire, a highly-pure copper wire thinned to have some wire diameter beforehand was prepared, and to form an outer coat layer of a different metal on the surface of the wire, electrolytic plating, electroless plating, vapor deposition, melting and the like were performed. In a case where a concentration gradient was to be formed, a heat treatment was carried out. A technique of forming an outer coat layer on a wire having a final wire diameter and a method of forming an outer coat layer on a wire having some wire diameter, and of thinning the wire to a final wire diameter by wire drawing were employed. Regarding an electrolytic plating solution and an electroless plating solution, plating solutions available commercially for semiconductor applications were used, and sputtering was employed as vapor deposition. Wires having a diameter of about 50 to 200 μm were prepared beforehand, and the surfaces of those wires were subjected to coating by vapor deposition, plating and the like, drawn to final wire diameters of 15 to 75 μm, and processing strains were removed, and heating was performed at last to achieve a degree of elongation of 4% or so. Wires were drawn to wire diameters of 30 to 100 μm using dies, subjected to a diffusion heat treatment, and then subjected to wire drawing as needed.

In a case where melting was adopted, a method of casing a melted metal around a core formed beforehand, and a method of casting melted copper or copper alloy into the center of a hollow cylinder produced beforehand were employed. Thereafter, processes, such as forging, rolling, and wire drawing using a die and a heating process were carried out, thereby producing a bonding wire.

Regarding a heating process of the examples of the wire of the present invention, a wire was heated while successively sweeping the wire. A scheme of introducing a temperature gradient locally and a scheme of changing a temperature in a furnace were used. The temperature difference was set to be a range from 30 to 200° C., a temperature distribution, a wire sweeping speed and the like were adjusted appropriately, so as to achieve a tensile elongation of about 4%. Regarding the atmosphere of a heat process, in addition to a room air, inert gases, such as $N_2$ and Ar were used in order to suppress any oxidization. Regarding the heating process step of a comparative example, samples were prepared through a process where a Cu wire having undergone wire drawing were heated and then a plating layer was formed, and through a process where heating was carried out twice after wire drawing and after a plating layer was formed.

To measure the thickness of a film on the surface of a multilayer copper wire, a surface analysis and a depth analysis through AES were carried out. The concentration of a conductive metal contained in a wire was measured through an ICP analysis, an ICP mass analysis, and the like.

To connect a bonding wire, ball/wedge bonding was performed using a commercially-available automatic wire bonder (made by ASM, type Eagle60-AP). A ball was formed at the leading end of a wire by arc discharge, bonded to an electrode film on a silicon substrate, and the other end of the wire was wedge bonded to a lead terminal. In order to suppress any oxidization when a ball was melted, discharging was carried out while spraying a predetermined atmosphere gas to the leading end of a wire. The angle and distance between the leading end of a bonding wire and a discharge torch were adjusted appropriately within the foregoing ranges. Arc discharging was stabilized by adjusting such a distance within a range from 1 to 1.5 mm to facilitate adjustment of the foregoing angle and attachment of a shielding gas pipe.

As a bonding target, an Al alloy film (Al-1% Si-0.5% Cu film, Al-0.5% Cu film) having a thickness of 1 μm which was a material of an electrode film on a silicon substrate was used. On the other hand, as a target of wedge bonding, a lead frame having an Ag plating on the surface thereof, or resin substrates having Au plating/Ni plating/Cu electrodes were used.

Regarding evaluation of an initial ball, twenty small balls having a ball diameter/wire diameter ratio within a range from 1.8 to 2.5 times were picked up, and observed through an optical microscope or an SEM, thereby evaluating three characteristics: sphericity; misalignment; and ball surface. In the evaluation of the sphericity, if greater than or equal to four balls having an abnormal shape were formed, it was considered as a failure, and a cross mark was put on a chart, if there was one to three abnormal-shaped balls and if the number of misalignment of a ball position relative to a bonding wire was greater than or equal to three, a triangle mark was put, if the number of misalignment was one to three, a circle mark was put as there was no big practical problem, and if the total number of misalignment and abnormal shape was less than or equal to one, a double circle mark was put as ball formation was good.

Regarding evaluation of a ball surface, the ball portions of twenty wires were observed through an SEM, if the number of balls having rough concavity and convexity greater than or equal to 10 μm on the surface or a foreign material attached thereto, it was considered as a failure, and a cross mark was put on a chart, if the number of balls having rough concavity and convexity was one to four and if the number of tiny concavity and convexity like an air bubble smaller than or equal to 5 μm was greater than or equal to five, a triangle mark was put, if there was no rough concavity and convexity, but if the number of tiny concavity and convexity was two to four, a circle mark was put as there was no practical problem, and if the number of tiny concavity and convexity was less than or equal to one, a double circle mark was put as a ball surface was good.

To observe air bubbles of initial ball portions, the cross-sections of ten balls were polished, and in a cross-section which was parallel to a wire direction and passed through the center of a ball, if the number of air bubbles greater than or equal to 10 μm was greater than or equal to two, a cross mark was put on a chart, if the number of air bubbles greater than or equal to 10 μm was less than or equal to one and if the number of air bubbles greater than or equal to 6 μm was greater than or equal to five, a triangle mark was put, if the number of air bubbles greater than or equal to 6 μm was two to four, a circle mark was put and if the number of air bubbles greater than or equal to 6 μm was less than or equal to one, a double circle mark was put.

To determine the bonding shape of a ball bonded portion, five hundred bonded balls were observed, and failures were categorized to off-centering, elliptical deformation, and petal-like deformation, and evaluated respectively. In addition to evaluation for a normal ball diameter having a bonding ball diameter/wire diameter ratio of 2.3 to 3.5 times, evaluation was carried out for a small-diameter ball having such a ratio of 1.6 to 2.3 times, only for evaluation of off-centering. Regarding evaluation of off-centering, if the number of remarkable off-centering was greater than or equal to ten, it was considered as a failure, and a cross mark was put on a chart, if the number of remarkable off-centering was within a range from three to nine, improvement was desirable as needed, so that a triangle mark was put, if the number of remarkable off-centering was less than or equal to two and if the number of minor off-centering was within a range from four to ten, it was considered as there was no practical problem and a circle mark was put, and if the number of minor off-centering was less than or equal to three, it was considered as good, so that a double circle mark was put. For elliptical deformation and petal-like deformation, failures were determined based on the same occurrence frequencies.

Regarding evaluation of the size stability of a ball bonded portion, the sizes of one hundred ball bonded portions were measured in a direction parallel to ultrasound and in a direction of ultrasound. Evaluation was carried out for a normal ball diameter having a bonding ball diameter/wire diameter ratio of 2.3 to 3.5 times and for a small-diameter ball within a range from 1.6 to 2.3 times. If the difference of ball diameters was greater than or equal to 3 µm, there was a variation so that a cross mark was put on a chart, if the difference was within a range from 1 µm to 3 µm and if the number of ball portions having an extreme size abnormality was greater than or equal to three, improvement was desirable as needed so that a triangle mark was put, if the difference was greater than or equal to 0.5 µm and less than 1 µm, it was considered as there was no practical problem so that a circle mark was put, and if the difference was less than 0.5 µm, the size was well stabilized so that a double circle mark was put.

Regarding evaluation of air-bubble traces at the surface of a ball bonded portion, four hundred ball portions were observed through an optical microscope, if the number of air-bubble traces greater than or equal to 10 µm was greater than or equal to four, a cross mark was put on a chart, if the number of air-bubble traces greater than or equal to 10 µm was less than or equal to three and if the number of air-bubble traces greater than or equal to 6 µm was greater than or equal to 10, a triangle mark was put, if there was no air-bubble trace greater than or equal to 10 µm and if the number of air-bubble traces greater than or equal to 6 µm was three to nine, it was considered as there was no practical problem so that a circle mark was put, and if there was no air-bubble trace greater than or equal to 10 µm and if the number of air-bubble traces greater than or equal to 6 µm was less than or equal to two, it was considered as good so that a double circle mark was put.

Regarding evaluation of air bubbles inside a ball bonded portion, forty ball bonded portion were cut in a direction perpendicular to a chip surface, and the cross-sections thereof were polished, if the number of air bubbles greater than or equal to 10 µm was greater than or equal to four, a cross mark was put on a chart, if the number of air bubbles greater than or equal to 10 µm was less than or equal to three and if the number of air bubbles greater than or equal to 6 µm was greater than or equal to ten, a triangle mark was put, if there was no air bubble greater than or equal to 10 µm and if the number of air bubbles greater than or equal to 6 µm was three to nine, it was considered as there was no practical problem so that a circle mark was put, and if there was no air bubble greater than or equal to 10 µm and if the number of air bubbles greater than or equal to 6 µm was less than or equal to two, it was considered as good so that a double circle mark was put.

Regarding evaluation of successive bonding characteristic of ball bonded portions, one thousand wires were connected, and the number of ball bonded portions peeled was evaluated. For acceleration evaluation, a load and a ultrasound vibration were set lower than mass-production conditions. If the ratio of a bonding ball diameter relative to a wire diameter become smaller and smaller, successive bonding become difficult, so that evaluation was carried out on the basis of two standards: a normal ball diameter having a bonding ball diameter/wire diameter ratio within a range from 2.3 to 3.5 times; and a small-diameter ball within a range from 1.6 to 2.3 times. Regarding each ball diameter standard, if the peeling number was greater than or equal to six, bonding was insufficient so that a cross mark was put on a chart, if it was three to five, a triangle mark was put, if it was one to two, it was considered as practical if bonding conditions were adjusted appropriately so that a circle mark was put, and if no peeling was observed, it was considered as a sufficient bonding strength so that a double circle mark was put.

Regarding any damage to a chip, a ball portion was bonded on an electrode film, the electrode film was removed by etching, and any damage to an insulation film or a silicon chip was observed through an SEM. Four hundred electrodes were observed. If no damage was confirmed, a double circle mark was put on a chart, if the number of cracks less than or equal to 5 µm was less than or equal to two, it was considered as there was no practical problem so that a circle mark was put, if the number of cracks greater than or equal to 5 µm but less than 20 µm was greater than or equal to two, it was considered as a level of concern so that a triangle mark was put, and if there was greater than or equal to one crack, cratered damage or the like greater than or equal to 20 µm, it was considered as a level of seriously concern so that a cross mark was put.

For evaluating wedge bonding, a total of one thousand bonding wire samples were subjected to low temperature bonding at 175° C. As evaluation criteria, if successive bonding operation was interrupted greater than or equal to twice due to any failures of a wedge bonded portion, it was considered as a poor wedge bonding characteristic so that a cross mark was put, if the number of bonding interruption was less than or equal to one and if the number of failure phenomena like peeling observed through an optical microscope was greater than or equal to five, it was considered as an insufficient wedge bonding characteristic so that a triangle mark was put, if successive bonding was possible but if the number of peeling observed was even one, it was possible to cope with such a phenomenon by changing a bonding condition so that a circle mark was put, and if successive bonding was possible and if no failure was observed, it was considered as a good wedge bonding characteristic so that a double circle mark was put.

Regarding evaluation of ball bonding strength, samples bonded at a low temperature of 150° C. were used. Shear test was performed on twenty ball bonded portion, the average of shear strengths was measured, and a shear strength per unit area calculated using the average of areas of ball bonded portions was achieved. If the shear strength per unit area was less than 70MPa, the bonding strength was insufficient so that a cross mark was put on a chart, if it was greater than or equal to 70 and less than 90MPa, the bonding strength could be improved by changing the bonding condition slightly so that a triangle mark was put, if it was greater than or equal to 90 and less than 110MPa, it was considered as there was no practical problem so that a circle mark was put, and if it was greater than or equal to 110MPa, it was considered as good so that a double circle mark was put.

Regarding the loop shape stability at a bonding step, trapezoidal loops were formed with two kinds of spans: a general-purpose span having a wire length of 2 mm; and a long span having a wire length of 4 mm, and for each span, four hundred bonding wires were observed through a profile projector, and the straightness of a bonding wire and variation in loop heights were determined. In formation of a trapezoidal loop with 4 mm of a wire length, in order to decrease variation in heights, a more severe loop control become necessary. In the case of 2 mm wire length, if the number of wires having failures in the straightness and the loop height was greater than or equal to five, it was considered as a problem so that a cross mark was put on a chart, if the number of wires having failures in 2 mm wire length was two to four and if the number of wires having failures in 4 mm wire length was greater than or equal to five, it was considered as improvement was necessary so that a triangle mark was put, if the number of wires having failures in 2 mm wire length was one and if the number of wires having failures in 4 mm wire length was two to four, the loop shape was relatively good so that a circle mark was put, and if the number of wires having failures in 4 mm wire length was less than or equal to one, it was considered that the loop shape was stable so that a double circle mark was put. It was expected that ones of the reasons of failures were insufficient adhesiveness at a boundary between a core member and an outer coat layer and variation in characteristics at a cross-section.

Regarding evaluation of capillary lifetime, fifty thousand bonding wires were connected and then any changes, such as contaminant and wear of the leading end of a capillary was checked. If the surface was clean, a circle mark was put on a chart, if there was a little attachment, there was no problem for normal operation so that a triangle mark was put, and if the amount and size of attachment were remarkable, a cross mark was put.

For the bonding reliability after heating, samples encapsulated by a resin after bonding were heated for 1500 hr at 150° C., 175° C., and 185° C., and then the electrical characteristics of forty bonding wires were evaluated. Regarding heating at 150° C., 175° C. and 185° C., heating conditions for general-purpose ICs, and for in-vehicle ICs were assumed. If the rate of bonding wires having an electrical resistance increased greater than or equal to three times as much as initial one was greater than or equal to 30%, it was a bonding failure so that a cross mark was put on a chart, if the rate of bonding wires having an electrical resistance increased greater than or equal to three times as much as initial one was greater than or equal to 5% and less than 30%, the bonding wires could be used for ICs that do not have a severe reliability requirement so that a triangle mark was put, if the rate of bonding wires having an electrical resistance increased greater than or equal to three times as much as initial one was less than 5% and if the rate of bonding wires having an electrical resistance increased greater than or equal to 1.5 times was greater than or equal to 10% and less than 30%, there was no practical problem so that a circle mark was put, and if the rate of bonding wires having an electrical resistance increased greater than or equal to 1.5 times was less than 10%, it was considered as good so that a double circle mark was put.

In a PCT (Pressure Cooker Test), wires were heated for 200 hours or 500 hours under a high temperature and high humidity condition of 121° C. and 100% of humidity. Thereafter, the electrical characteristics of forty bonding wires were evaluated. If the rate of bonding wires having electrical resistance increased greater than or equal to 3 times as much as an initial one was greater than or equal to 30%, it was considered as a bonding failure so that a cross mark was put on a chart, if the rate of bonding wires having an electrical resistance increased greater than or equal to three times was greater than or equal to 5% and less than 30%, the bonding wires could be used for ICs that do not have a severe reliability requirement so that a triangle mark was put, if the rate of bonding wires having an electrical resistance increased greater than or equal to three times was less than 5% and if the rate of bonding wires having an electrical resistance increased greater than or equal to 1.5 times was greater than or equal to 10% and less than 30%, there was no practical problem so that a circle mark was put, and if the rate of bonding wires having an electrical resistance increased greater than or equal to 1.5 times was less than 10%, it was considered as good so that a double circle mark was put.

For the surface analysis of a ball bonded portion of a bonding wire and the concentration analysis of a bonding interface, a point analysis and a line analysis mainly using EPMA, EDX, and Auger spectroscopy analyzer were carried out. Analysis was carried out at an area having a diameter greater than or equal to 0.1 μm, and the maximum concentration or an average concentration was achieved. In actual production, usage of a semiconductor device, because steps and histories after ball bonding vary, analysis was carried out using samples having undergone different steps and heat histories. For example, samples right after ball bonding, after resin encapsulation and cure heating, and after a reliability test like a heating test were used. Moreover, in a case where a interface concentrated layer was observed after an accelerated heating process was performed, investigation was carried out through the foregoing analysis techniques after a semiconductor device was heated for 200 hours at 175° C.

Tables 1 to 6 show the evaluation results of semiconductor devices connected with copper bonding wires according to the present invention and comparative examples. Tables 1 and 2 are for monolayer copper wires, and tables 3 and 4 are for multilayer copper wires. Tables 5 and 6 distinguishingly show the results of carefully checking the vicinity of the interface of a ball bonded portion and a concentrated layer formed in a diffusion layer or an intermetallic compound, and in particularly, table 6 shows results of checking formation of a diffusion layer or an intermetallic compound using a ball bonded portion of a semiconductor device heated for 200 hours at 175° C.

TABLE 1

| | EXAMPLE NO. | CONCENTRATED LAYER AT BALL BONDED BOUNDARY FACE | | CONCENTRATED LAYER AT SURFACE OF BALL BONDED PORTION | MONOLAYER COPPER WIRE | |
|---|---|---|---|---|---|---|
| | | CONCENTRATED METAL AND MAXIMUM CONCENTRATION/mol % | THICKNESS/μm | CONCENTRATED METAL AND MAXIMUM CONCENTRATION/mol % | ADDITION INGREDIENT AND ADDITION CONCENTRATION/mol % | LINE DIAMETER/μm |
| EX. OF PRESENT INVENTION | A1 | Pd0.5 | 0.3 | — | Pd0.18 | 18 |
| | A2 | Pd2 | 1 | Pd0.1 | Pd1 | 50 |
| | A3 | Pt3.5 | 0.5 | Pt2 | Pt0.4 | 20 |
| | A4 | Au0.1 | 0.3 | Au0.05 | Au0.01 | 75 |
| | A5 | Ag 4 | 1 | Ag3 | Ag0.3 | 25 |
| | A6 | Sn 2 | 1 | Sn2 | Sn0.5 | 25 |
| | A7 | P0.1 | 0.3 | P0.2 | P0.005 | 50 |
| | A8 | Rh2 | 1 | Rh1.5 | Rh0.2 | 25 |
| | A9 | Au0.5, Pd2 | 2 | Au0.3, Pd2 | Au0.01, Pd0.2 | 25 |
| | A10 | Pd0.8, P2 | 1 | Pd0.8, P1 | Pd0.1, P0.01 | 25 |
| | A11 | Pt1, Sn1.5 | 0.5 | Pt0.5, Sn1 | Pt0.01, Sn0.1 | 33 |
| | A12 | Pd1, Ag2 | 0.8 | Pd0.2, Ag1 | Pd0.1, Ag0.1 | 25 |
| | A13 | Rh0.7, P0.5 | 1 | Rh0.5, P0.5 | Rh0.1, P0.005 | 25 |
| COMPARATIVE EXAMPLE | X1 | — | — | — | —(pure Cu) | 50 |
| | X2 | — | — | — | Pd0.01 | 25 |
| | X3 | — | — | — | Pt0.1 | 25 |
| | X4 | Pd0.03 | 0.2 | — | Au0.001 | 25 |

TABLE 1-continued

| | | | | Sn0.02 | Sn0.01 | 30 |
|---|---|---|---|---|---|---|
| X5 | — | | — | | | |

| | | BALL FORMATION GAS | | | | | |
|---|---|---|---|---|---|---|---|
| | EXAMPLE NO. | KIND OF GAS | GAS FLOW RATE m³/min | SPRAYING TECHNIQUE A: ONE DIRECTION B: TWO DIRECTION C: ANNULARLY | ANGLE BETWEEN GREATER THAN OR EQUAL TO TWO GAS PIPES (DEGREE) | GAS SPRAYING ANGLE (DEGREE) | TORCH ANGLE (DEGREE) |
| EX. OF PRESENT INVENTION | A1 | 5% H₂ + N₂ | 0.0012 | B | 90 | 90 | 40 |
| | A2 | 2% H₂ + Ar | 0.001 | B | 120 | 100 | 40 |
| | A3 | 20% Ar + N₂ | 0.0005 | C | — | — | 50 |
| | A4 | 1% H₂ + Ar | 0.001 | A | — | 90 | 80 |
| | A5 | 5% H₂ + N₂ | 0.00003 | A | — | 120 | 45 |
| | A6 | 5% H₂ + N₂ | 0.004 | B | 120 | 50 | 45 |
| | A7 | 2% H₂ + N₂ | 0.001 | A | — | 60 | 60 |
| | A8 | 5% H₂ + Ar | 0.001 | C | — | — | 40 |
| | A9 | 10% Ar + N₂ | 0.0007 | B | 180 | 120 | 40 |
| | A10 | 0.05% H₂ + Ar | 0.001 | A | — | 170 | 80 |
| | A11 | 30% Ar + N₂ | 0.0005 | B | 90 | 130 | 60 |
| | A12 | 7% H₂ + N₂ | 0.001 | A | — | 60 | 40 |
| | A13 | 5% H₂ + Ar | 0.001 | B | 150 | 90 | 20 |
| COMPARATIVE EXAMPLE | X1 | 5% H₂ + N₂ | 0.002 | A | — | 20 | 70 |
| | X2 | 2% H₂ + N₂ | 0.00002 | B | 20 | 30 | 70 |
| | X3 | 1% H2 + Ar | 0.007 | A | — | 180 | 50 |
| | X4 | 5% H2 + Ar | 0.001 | B | 90 | 70 | 70 |
| | X5 | 5% H2 + Ar | 0.001 | B | 90 | 50 | 70 |

TABLE 2

| | | BONDING RELIABILITY | | | AIR BUBBLE AT BONDED PORTION | | INITIAL BALL | | |
|---|---|---|---|---|---|---|---|---|---|
| | EXAMPLE NO. | HEATING @ 150° C. | HEATING @ 175° C. | PCT (200 h) | AIR BUBBLE | BUBBLE TRACE | AIR BUBBLE, BUBBLE TRACE | SURFACE FLATNESS | SPHERICITY |
| EX. OF PRESENT INVENTION | A1 | ◎ | ○ | △ | ○ | ○ | ○ | ○ | ◎ |
| | A2 | ◎ | ◎ | ◎ | ◎ | ○ | ◎ | ○ | ◎ |
| | A3 | ◎ | △ | ◎ | ◎ | ◎ | ○ | ○ | ◎ |
| | A4 | ○ | △ | △ | ◎ | ○ | ◎ | ○ | ◎ |
| | A5 | ◎ | ○ | ◎ | ○ | ○ | ○ | ○ | ◎ |
| | A6 | ◎ | ○ | ◎ | ○ | ◎ | ○ | ○ | ◎ |
| | A7 | ○ | △ | ○ | ○ | ○ | ○ | ○ | ◎ |
| | A8 | ◎ | ○ | ◎ | ◎ | ○ | ○ | ○ | ◎ |
| | A9 | ◎ | ◎ | ◎ | ◎ | ◎ | ○ | ○ | ◎ |
| | A10 | ◎ | ○ | ◎ | ◎ | ○ | ○ | ○ | ◎ |
| | A11 | ◎ | ○ | ◎ | ○ | ◎ | ○ | ○ | ◎ |
| | A12 | ◎ | ○ | ◎ | ○ | ○ | ○ | ○ | ◎ |
| | A13 | ◎ | ○ | ◎ | ◎ | ○ | ◎ | ○ | ◎ |
| COMPARATIVE EXAMPLE | X1 | X | X | X | ○ | ○ | ○ | ○ | ○ |
| | X2 | X | X | X | ○ | ○ | ○ | ○ | ○ |
| | X3 | X | X | X | ○ | ○ | ○ | ○ | ○ |
| | X4 | X | X | X | ○ | ○ | ○ | ○ | ○ |
| | X5 | X | X | X | ○ | ○ | ○ | ○ | ○ |

| | | BALL BONDING CHARACTERISTIC | | | | | | | |
|---|---|---|---|---|---|---|---|---|---|
| | | OFF-CENTERING | | ELLIPTICAL DEFORMATION | PETAL-LIKE DEFORMATION | SUCCESSIVE BONDING CHARACTERISTIC | | BONDING SIZE | |
| | EXAMPLE NO. | NORMAL BALL DIAMETER | SMALL-DIAMETER BALL | | | NORMAL BALL DIAMETER | SMALL-DIAMETER BALL BONDING | NORMAL BALL DIAMETER | SMALL-DIAMETER BALL |
| EX. OF PRESENT INVENTION | A1 | ◎ | ◎ | ○ | ○ | ◎ | ◎ | ○ | ◎ |
| | A2 | ◎ | ◎ | ○ | ○ | ◎ | ◎ | ◎ | ◎ |
| | A3 | ◎ | ○ | ◎ | ◎ | ◎ | ◎ | ◎ | ◎ |
| | A4 | ○ | ◎ | ○ | ○ | ◎ | ◎ | ◎ | △ |

TABLE 2-continued

|  | | | | | | | | | | |
|---|---|---|---|---|---|---|---|---|---|---|
|  | A5 | ⊚ | ⊚ | ○ | ⊚ | ○ | Δ | ○ | Δ | |
|  | A6 | ⊚ | ⊚ | ○ | ⊚ | ⊚ | ○ | ○ | ⊚ | |
|  | A7 | ⊚ | ⊚ | ○ | ⊚ | ⊚ | ⊚ | ⊚ | Δ | |
|  | A8 | ⊚ | ○ | ○ | ⊚ | ⊚ | ⊚ | ⊚ | ⊚ | |
|  | A9 | ⊚ | ⊚ | ⊚ | ⊚ | ⊚ | ⊚ | ⊚ | ⊚ | |
|  | A10 | ○ | ○ | ○ | ⊚ | ⊚ | ⊚ | ○ | Δ | |
|  | A11 | ⊚ | ⊚ | ⊚ | ⊚ | ⊚ | ⊚ | ⊚ | ⊚ | |
|  | A12 | ⊚ | ⊚ | ○ | ⊚ | ⊚ | ⊚ | ○ | Δ | |
|  | A13 | ⊚ | ○ | ○ | ⊚ | ⊚ | ⊚ | ⊚ | ⊚ | |
| COMPARATIVE | X1 | Δ | Δ | X | X | X | ○ | ⊚ | Δ | |
| EXAMPLE | X2 | Δ | Δ | ○ | ○ | X | X | Δ | Δ | |
|  | X3 | ○ | Δ | ○ | ○ | ○ | ○ | Δ | Δ | |
|  | X4 | Δ | Δ | ○ | ○ | ○ | ○ | ⊚ | Δ | |
|  | X5 | Δ | Δ | ○ | ○ | ○ | ○ | ⊚ | Δ | |

|  | EXAMPLE NO. | INITIAL BONDING STRENGTH AT LOW TEMP. | CHIP DAMAGE | WEDGE BONDING CHARACTERISTIC NORMAL TEMP. @ 190° C. | WEDGE BONDING CHARACTERISTIC LOW TEMP. @ 150° C. | LOOP SHAPE | CONTAMINATION OF LEADING END OF CAPILLARY |
|---|---|---|---|---|---|---|---|
| EX. OF PRESENT INVENTION | A1 | ⊚ | ⊚ | Δ | Δ | ○ | ⊚ |
|  | A2 | ⊚ | Δ | Δ | Δ | ○ | ⊚ |
|  | A3 | ○ | Δ | Δ | Δ | ○ | ⊚ |
|  | A4 | ⊚ | ⊚ | Δ | Δ | ○ | ⊚ |
|  | A5 | ○ | ⊚ | Δ | Δ | ○ | ⊚ |
|  | A6 | ⊚ | ⊚ | Δ | Δ | ○ | ⊚ |
|  | A7 | ⊚ | ⊚ | Δ | Δ | ○ | ⊚ |
|  | A8 | ⊚ | ⊚ | Δ | Δ | ○ | ⊚ |
|  | A9 | ⊚ | ⊚ | Δ | Δ | ○ | ⊚ |
|  | A10 | ⊚ | ⊚ | Δ | Δ | ○ | ⊚ |
|  | A11 | ⊚ | ⊚ | Δ | Δ | ○ | ⊚ |
|  | A12 | ⊚ | ⊚ | Δ | Δ | ○ | ⊚ |
|  | A13 | ⊚ | ⊚ | Δ | Δ | ○ | ⊚ |
| COMPARATIVE EXAMPLE | X1 | Δ | ⊚ | X | X | X | ○ |
|  | X2 | ○ | ⊚ | Δ | Δ | ○ | ⊚ |
|  | X3 | ○ | ⊚ | ○ | Δ | ○ | ⊚ |
|  | X4 | Δ | ⊚ | Δ | Δ | ○ | ⊚ |
|  | X5 | Δ | ⊚ | Δ | Δ | ○ | ⊚ |

TABLE 3

|  | EXAMPLE NO. | CONCENTRATED LAYER AT BALL BONDED BOUNDARY FACE | | | CONCENTRATED LAYER AT SURFACE OF BALL BONDED PORTION | |
|---|---|---|---|---|---|---|
|  |  | CONCENTRATED METAL | MAXIMUM CONCENTRATION/ mol % | THICKNESS/ μm | CONCENTRATED METAL | MAXIMUM CONCENTRATION/ mol % |
| EX. OF PRESENT INVENTION | B1 | Pd | 0.1 | 0.2 | Pd | 0.08 |
|  | B2 | Pd | 0.2 | 2 | Pd | 0.1 |
|  | B3 | Pd | 0.5 | 3 | Pd | 0.3 |
|  | B4 | Pd | 2 | 0.8 | Pd | 1.3 |
|  | B5 | Pd | 4 | 2 | Pd | 3 |
|  | B6 | Pd | 17 | 1 | Pd | 4.5 |
|  | B7 | Pt | 0.2 | 2 | Pt | 0.2 |
|  | B8 | Pt | 3 | 0.5 | Pt | 2 |
|  | B9 | Au | 1 | 1 | Au | 0.7 |
|  | B10 | Pd | 1 | 0.3 | Pd | 0.8 |
|  | B11 | Pd | 0.5 | 4 | Pd | 0.4 |
|  | B12 | Pd | 0.3 | 2 | Pd | 0.3 |
|  | B13 | Pd | 0.2 | 0.7 | Pd | 0.15 |
|  | B14 | Pd | 0.5 | 1 | Pd | 0.4 |
|  | B15 | Pd | 0.2 | 0.4 | Pd | 0.2 |
|  | B16 | Pd | 1 | 1 | Pd | 0.7 |
|  | B17 | Pd | 0.4 | 2 | Pd | 0.4 |
|  | B18 | Pd | 2.5 | 1 | Pd | 2 |
|  | B19 | Rh | 0.8 | 0.5 | Rh | 0.7 |
|  | B20 | Pd | 0.3 | 3 | Pd | 0.3 |
|  | B21 | Pd | 0.5 | 2 | Pd | 0.5 |
|  | B22 | Pd | 0.1 | 1 | Pd | 0.2 |

TABLE 3-continued

| | | | | | | |
|---|---|---|---|---|---|---|
| COMPARATIVE EXAMPLE | Y1 | — | — | — | — | — |
| | Y2 | Pd | 0.03 | 0.1 | — | — |
| | Y3 | Pd | 0.05 | 0.1 | Pd | 0.03 |
| | Y4 | — | — | — | Pd | 0.05 |
| | Y5 | Pd | 25 | 2 | Pd | 13 |

MULTILAYER COPPER WIRE — OUTER COAT LAYER

| | EXAMPLE NO. | CONDUCTIVE METAL | LAYER THICKNESS/ μm | METAL CONCENTRATION AT MOST OUTER SURFACE/ mol % | CONCENTRATION GRADIENT THICKNESS/ μm | RESIDUE | CORE MATERIAL | LINE DIAMETER/ μm |
|---|---|---|---|---|---|---|---|---|
| EX. OF PRESENT INVENTION | B1 | Pd | 0.004 | 95 | — | Cu | Cu | 25 |
| | B2 | Pd | 0.008 | 50 | 0.005 | Cu | Cu | 20 |
| | B3 | Pd | 0.03 | 85 | 0.003 | Cu | Cu | 25 |
| | B4 | Pd | 0.08 | 65 | 0.03 | Cu | Cu | 25 |
| | B5 | Pd | 0.3 | 92 | 0.08 | Cu | Cu | 15 |
| | B6 | Pd | 0.8 | 90 | 0.5 | Cu | Cu | 23 |
| | B7 | Pt | 0.04 | 40 | 0.03 | Cu | Cu | 30 |
| | B8 | Pt | 0.3 | 85 | 0.05 | Cu | Cu | 25 |
| | B9 | Au | 0.1 | 73 | 0.03 | Cu | Cu | 25 |
| | B10 | Pd | 0.001 | 45 | 0.001 | Cu | Cu | 25 |
| | B11 | Pd | 0.15 | 70 | 0.07 | Cu | Cu | 25 |
| | B12 | Pd | 0.01 | 20 | 0.01 | Cu | Cu | 25 |
| | B13 | Pd | 0.07 | 40 | 0.05 | Cu | Cu | 11 |
| | B14 | Pd | 0.1 | 100 | 0.02 | Cu | Cu | 33 |
| | B15 | Pd | 0.03 | 73 | 0.01 | Cu | Cu | 50 |
| | B16 | Pd | 0.2 | 98 | 0.05 | Cu | Cu | 25 |
| | B17 | Pd | 0.02 | 64 | 0.01 | Cu | Cu | 25 |
| | B18 | Pd | 0.6 | 37 | 0.5 | Cu | Cu | 25 |
| | B19 | Rh | 0.2 | 46 | 0.1 | Cu | Cu | 20 |
| | B20 | Pd | 0.06 | 95 | 0.02 | Cu | Cu | 25 |
| | B21 | Pd | 0.1 | 45 | 0.04 | Cu | Cu | 25 |
| | B22 | Pd | 0.03 | 23 | 0.03 | Cu | Cu | 25 |
| COMPARATIVE EXAMPLE | Y1 | Pd | 0.001 | 70 | — | Cu | Cu | 25 |
| | Y2 | Pt | 0.002 | 32 | 0.002 | Cu | Cu | 25 |
| | Y3 | Pd | 0.002 | 40 | 0.001 | Cu | Cu | 25 |
| | Y4 | Pd | 0.01 | 52 | 0.008 | Cu | Cu | 25 |
| | Y5 | Pd | 1 | 100 | 0.1 | Cu | Cu | 25 |

BALL FORMATION GAS

| | EXAMPLE NO. | MANUFACTURING METHOD (A: ELECTROLESS, B: ELECTROLYTIC, C: VAPOR DEPOSITION, D: HALF-MELTING) | KIND OF GAS | GAS FLOW RATE m³/min | SPRAYING TECHNIQUE A: ONE DIRECTION B: TWO DIRECTION C: ANNULARLY | ANGLE BETWEEN GREATER THAN OR EQUAL TO TWO GAS PIPES (DEGREE) | GAS SPRAYING ANGLE (DEGREE) | TORCH ANGLE (DEGREE) |
|---|---|---|---|---|---|---|---|---|
| EX. OF PRESENT INVENTION | B1 | A | 3% $H_2$ + Ar | 0.001 | A | — | 90 | 45 |
| | B2 | B | 2% $H_2$ + Ar | 0.002 | B | 90 | 50 | 40 |
| | B3 | B | 5% $H_2$ + $N_2$ | 0.0015 | B | 180 | 70 | 30 |
| | B4 | B | 3% $H_2$ + Ar | 0.0008 | B | 120 | 90 | 40 |
| | B5 | B | 20% Ar + $N_2$ | 0.0002 | C | — | — | 20 |
| | B6 | D | 3% $H_2$ + Ar | 0.0002 | A | — | 130 | 70 |
| | B7 | B | 2% $H_2$ + Ar | 0.0008 | B | 90 | 120 | 10 |
| | B8 | B | 5% $H_2$ + Ar | 0.0005 | B | 90(3PIPES) | 120 | 20 |
| | B9 | C | 7% $H_2$ + Ar | 0.00006 | B | 120 | 150 | 40 |
| | B10 | A | 0.2% $H_2$ + Ar | 0.0002 | A | — | 50 | 40 |
| | B11 | B | 0.03% $H_2$ + Ar | 0.0015 | B | 90 | 70 | 80 |
| | B12 | A | 15% $H_2$ + Ar | 0.003 | A | — | 30 | 20 |
| | B13 | B | pure Ar | 0.0005 | B | 140 | 100 | 30 |
| | B14 | B | pure $N_2$ | 0.0002 | A | — | 130 | 40 |
| | B15 | B | 3% $H_2$ + $N_2$ | 0.0004 | B | 90 | 120 | 40 |
| | B16 | D | 30% Ar + $N_2$ | 0.001 | B | 180 | 90 | 30 |
| | B17 | B | 2% $H_2$ + Ar | 0.0025 | B | 120 | 90 | 40 |
| | B18 | B | 50% Ar + $N_2$ | 0.001 | A | — | 170 | 40 |
| | B19 | C | 5% $H_2$ + Ar | 0.0013 | B | — | 100 | 70 |
| | B20 | B | 1% $H_2$ + Ar | 0.0005 | B | 150 | 100 | 50 |
| | B21 | B | 5% Ar + $N_2$ | 0.0003 | B | 120 | 120 | 50 |
| | B22 | B | 7% $H_2$ + Ar | 0.00008 | A | — | 90 | 25 |

TABLE 3-continued

| | | | | | | | | |
|---|---|---|---|---|---|---|---|---|
| COMPARATIVE EXAMPLE | Y1 | B | 5% H$_2$ + Ar | 0.001 | A | — | 100 | 80 |
| | Y2 | B | pure Ar | 0.001 | C | — | — | 70 |
| | Y3 | B | 2% H$_2$ + N$_2$ | 0.001 | A | — | 100 | 70 |
| | Y4 | B | pure N$_2$ | 0.0001 | B | 40 | 90 | 70 |
| | Y5 | A | 5% H$_2$ + N$_2$ | 0.001 | A | — | 90 | 45 |

TABLE 4

| | EXAMPLE NO. | BONDING RELIABILITY | | | AIR BUBBLE AT BONDED PORTION | | INITIAL BALL | | | |
|---|---|---|---|---|---|---|---|---|---|---|
| | | HEATING @ 150° C. | HEATING @ 175° C. | PCT (200 h) | AIR BUBBLE | SURFACE BUBBLE TRACE | AIR BUBBLE, AIR BUBBLE TRACE | SURFACE FLATNESS | SPHERICITY | |
| EX. OF PRESENT INVENTION | B1 | ○ | ○ | ○ | ◎ | ○ | ◎ | ◎ | ◎ | |
| | B2 | ◎ | ◎ | ◎ | ◎ | ○ | ◎ | ○ | ◎ | |
| | B3 | ◎ | ◎ | ◎ | ○ | ○ | ○ | ◎ | ◎ | |
| | B4 | ◎ | ◎ | ◎ | ◎ | ○ | ◎ | ◎ | ◎ | |
| | B5 | ◎ | ◎ | ◎ | ○ | ◎ | ○ | ◎ | ◎ | |
| | B6 | ◎ | ◎ | ◎ | ◎ | ○ | ◎ | ◎ | ◎ | |
| | B7 | ◎ | ○ | ◎ | ◎ | ○ | ◎ | ○ | ◎ | |
| | B8 | ◎ | ○ | ◎ | ◎ | ○ | ◎ | ◎ | ◎ | |
| | B9 | ◎ | ○ | ◎ | ◎ | ○ | ○ | ◎ | ◎ | |
| | B10 | ◎ | ○ | ◎ | ◎ | ○ | ◎ | ○ | ◎ | |
| | B11 | ◎ | ◎ | ◎ | ◎ | ○ | ○ | ◎ | ◎ | |
| | B12 | ◎ | ◎ | ◎ | ◎ | ○ | ○ | ○ | ○ | |
| | B13 | ○ | ○ | ○ | Δ | Δ | ○ | ○ | ◎ | |
| | B14 | ○ | ○ | ○ | Δ | Δ | ○ | ◎ | ◎ | |
| | B15 | ◎ | ○ | ◎ | ○ | ○ | ○ | ◎ | ◎ | |
| | B16 | ◎ | ◎ | ◎ | ◎ | ◎ | ◎ | ◎ | ◎ | |
| | B17 | ◎ | ◎ | ◎ | ◎ | ○ | ◎ | ◎ | ◎ | |
| | B18 | ◎ | ◎ | ◎ | ○ | ◎ | ○ | ○ | ◎ | |
| | B19 | ◎ | ○ | ◎ | ◎ | ○ | ◎ | ○ | ◎ | |
| | B20 | ◎ | ◎ | ◎ | ◎ | ○ | ◎ | ◎ | ◎ | |
| | B21 | ◎ | ◎ | ◎ | ○ | ◎ | ○ | ○ | ◎ | |
| | B22 | ○ | ◎ | ◎ | ◎ | ○ | ○ | ○ | ○ | |
| COMPARATIVE EXAMPLE | Y1 | X | X | X | ○ | ○ | ○ | ○ | ○ | |
| | Y2 | X | X | X | Δ | ○ | ○ | ○ | ○ | |
| | Y3 | X | X | X | Δ | ○ | ○ | ○ | ○ | |
| | Y4 | X | X | Δ | Δ | ○ | ○ | ○ | ○ | |
| | Y5 | ○ | ○ | Δ | Δ | ○ | ○ | ○ | ○ | |

| | EXAMPLE NO. | BALL BONDING CHARACTERISTIC | | | | | | | |
|---|---|---|---|---|---|---|---|---|---|
| | | OFF-CENTERING | | ELLIPTICAL DEFORMATION | PETAL-LIKE DEFORMATION | SUCCESSIVE BONDING CHARACTERISTIC | | BONDING SIZE | |
| | | NORMAL BALL DIAMETER | SMALL-DIAMETER BALL | | | NORMAL BALL DIAMETER | SMALL-DIAMETER BALL BONDING | NORMAL BALL DIAMETER | SMALL-DIAMETER BALL |
| EX. OF PRESENT INVENTION | B1 | ◎ | ◎ | ○ | ○ | ◎ | ◎ | ◎ | Δ |
| | B2 | ◎ | ◎ | ○ | ○ | ◎ | ◎ | ○ | ○ |
| | B3 | ◎ | ◎ | Δ | ◎ | ◎ | ◎ | ○ | ○ |
| | B4 | ◎ | ◎ | ○ | ◎ | ◎ | ◎ | ◎ | ◎ |
| | B5 | ◎ | ○ | ◎ | ◎ | ◎ | ◎ | ◎ | ◎ |
| | B6 | ○ | ◎ | ○ | ◎ | ◎ | ◎ | ◎ | Δ |
| | B7 | ◎ | ◎ | ○ | ◎ | ◎ | ◎ | ◎ | ◎ |
| | B8 | ◎ | ◎ | ○ | ◎ | ◎ | ◎ | ◎ | ◎ |
| | B9 | ◎ | ◎ | ○ | ◎ | ◎ | ○ | ○ | ○ |
| | B10 | ◎ | ◎ | ○ | ◎ | ◎ | ◎ | ◎ | Δ |
| | B11 | ○ | ◎ | ○ | ◎ | ◎ | ◎ | ○ | ○ |
| | B12 | ◎ | ○ | ○ | ◎ | ◎ | ○ | ○ | Δ |
| | B13 | ◎ | ◎ | Δ | ○ | ◎ | ◎ | ◎ | ◎ |
| | B14 | ◎ | ◎ | Δ | ○ | ◎ | ◎ | ◎ | Δ |
| | B15 | ◎ | ◎ | ○ | ◎ | ◎ | ◎ | ◎ | ◎ |
| | B16 | ◎ | ◎ | ◎ | ◎ | ◎ | ◎ | ◎ | ◎ |
| | B17 | ◎ | ◎ | ○ | ◎ | ◎ | ◎ | ○ | ○ |
| | B18 | ◎ | ○ | ◎ | ◎ | ◎ | ◎ | ◎ | Δ |

TABLE 4-continued

|  | | | | | | | | | |
|---|---|---|---|---|---|---|---|---|---|
|  | B19 | ○ | ◎ | ○ | ◎ | ◎ | ◎ | ○ | ◎ |
|  | B20 | ◎ | ◎ | ○ | ◎ | ◎ | ◎ | ◎ | ◎ |
|  | B21 | ◎ | ◎ | ◎ | ◎ | ◎ | ◎ | ◎ | ◎ |
|  | B22 | ◎ | ◎ | ○ | ◎ | ◎ | ○ | ○ | ◎ |
| COMPARATIVE EXAMPLE | Y1 | △ | △ | ○ | ○ | ○ | ○ | ◎ | ○ |
|  | Y2 | △ | △ | △ | ○ | ○ | ○ | ◎ | ○ |
|  | Y3 | △ | △ | ○ | ○ | ○ | ○ | ◎ | ○ |
|  | Y4 | △ | △ | △ | ○ | ○ | X | ◎ | ○ |
|  | Y5 | ○ | △ | △ | X | ○ | ○ | ◎ | ○ |

| | | INITIAL BONDING STRENGTH | | WEDGE BONDING CHARACTERISTIC | | | CONTAMINATION OF |
|---|---|---|---|---|---|---|---|
| | EXAMPLE NO. | AT LOW TEMP. | CHIP DAMAGE | NORMAL TEMP. @ 190° C. | LOW TEMP. @ 150° C. | LOOP SHAPE | LEADING END OF CAPILLARY |
| EX. OF PRESENT INVENTION | B1 | ◎ | ◎ | ◎ | ◎ | ○ | ○ |
|  | B2 | ◎ | ◎ | ◎ | ◎ | ◎ | ◎ |
|  | B3 | ◎ | ◎ | ◎ | ◎ | ◎ | ◎ |
|  | B4 | ◎ | ◎ | ◎ | ◎ | ◎ | ○ |
|  | B5 | ○ | ○ | ◎ | ◎ | ◎ | ◎ |
|  | B6 | ○ | ○ | ◎ | ◎ | ◎ | ○ |
|  | B7 | ◎ | ◎ | ◎ | ○ | ◎ | ◎ |
|  | B8 | ◎ | ○ | ◎ | ○ | ◎ | ◎ |
|  | B9 | ◎ | ◎ | ◎ | ○ | ○ | ◎ |
|  | B10 | ◎ | ◎ | ◎ | ○ | ◎ | ○ |
|  | B11 | ◎ | ◎ | ◎ | ◎ | ◎ | ◎ |
|  | B12 | ◎ | ◎ | ◎ | ◎ | ◎ | ◎ |
|  | B13 | ◎ | ◎ | ◎ | ◎ | ◎ | ◎ |
|  | B14 | ◎ | ◎ | ◎ | ◎ | ◎ | ◎ |
|  | B15 | ◎ | ◎ | ◎ | ◎ | ◎ | ◎ |
|  | B16 | ◎ | ◎ | ◎ | ◎ | ◎ | ◎ |
|  | B17 | ◎ | ◎ | ◎ | ◎ | ◎ | ◎ |
|  | B18 | ◎ | ○ | ◎ | ◎ | ◎ | ○ |
|  | B19 | ◎ | ◎ | ◎ | ○ | ◎ | ◎ |
|  | B20 | ◎ | ◎ | ◎ | ◎ | ◎ | ◎ |
|  | B21 | ◎ | ◎ | ◎ | ◎ | ◎ | ◎ |
|  | B22 | ◎ | ◎ | ◎ | ◎ | ◎ | ◎ |
| COMPARATIVE EXAMPLE | Y1 | ○ | ◎ | ○ | ○ | △ | ○ |
|  | Y2 | ○ | ◎ | ○ | ○ | ◎ | ○ |
|  | Y3 | ○ | ◎ | ○ | ○ | ◎ | ○ |
|  | Y4 | ○ | ◎ | ◎ | ○ | ◎ | ◎ |
|  | Y5 | ○ | X | ◎ | ◎ | △ | △ |

TABLE 5

| | | CONCENTRATED LAYER AT BALL BONDED BOUNDARY FACE | | THICKNESS OF CONCENTRATED LAYER WHERE CONCENTRATION OF CONCENTRATED METAL IS 0.5 TO 30 mol %/μm | | MULTILAYER COPPER WIRE OUTER COAT LAYER | | |
|---|---|---|---|---|---|---|---|---|
| | EXAMPLE NO. | CONCENTRATED METAL | THICKNESS/ μm | DIFFUSION LAYER | INTERMETALLIC COMPOUND | CONDUCTIVE METAL | LAYER THICKNESS/ μm | CONCENTRATION GRADIENT THICKNESS μm |
| EX. OF PRESENT INVENTION | C1 | Pd | 0.1 | 0.05 | — | Pd | 0.05 | 0.002 |
|  | C2 | Pd | 0.7 | 0.3 | 0.05 | Pd | 0.05 | 0.002 |
|  | C3 | Pd | 1 | 0.1 | 0.2 | Pd | 0.1 | 0.005 |
|  | C4 | Pd | 1.2 | 0.2 | 1 | Pd | 0.2 | 0.003 |
|  | C5 | Pd | 0.2 | — | 0.2 | Pd | 0.2 | 0.01 |
|  | C6 | Pd | 1.5 | — | 1.5 | Pd | 0.4 | 0.01 |
|  | C7 | Pt | 0.2 | 0.1 | — | Pt | 0.06 | 0.008 |
|  | C8 | Pt | 0.8 | 0.2 | 0.6 | Pt | 0.9 | 0.01 |
|  | C9 | Rh | 0.4 | 0.3 | 0.1 | Rh | 0.04 | 0.03 |
|  | C10 | Rh | 0.5 | — | — | Rh | 0.6 | 0.002 |

TABLE 5-continued

| | | MULTILAYER COPPER WIRE | | | | | | |
|---|---|---|---|---|---|---|---|---|
| | | | | MANUFACTURING METHOD(A: ELECTROLESS, B: ELECTROLYTIC, C: VAPOR DEPOSITION, D: HALF-MELTING) | BALL FORMATION GAS | | | |
| | EXAMPLE NO. | CORE MATERIAL | LINE DIAMETER/ μm | | KIND OF GAS | GAS FLOW RATE m³/min | SPRAYING TECHNIQUE A: ONE DIRECTION B: TWO DIRECTION C: ANNULARLY | GAS SPRAYING ANGLE (DEGREE) |
| EX. OF PRESENT INVENTION | C1 | Cu | 25 | B | 5% H₂ + N₂ | 0.006 | A | 160 |
| | C2 | Cu | 50 | A | pure N₂ | 0.006 | A | 180 |
| | C3 | Cu | 25 | B | pure N₂ | 0.008 | A | 180 |
| | C4 | Cu | 25 | B | pure N₂ | 0.006 | A | 180 |
| | C5 | Cu | 20 | B | pure N₂ | 0.005 | A | 180 |
| | C6 | Cu | 25 | B | pure N₂ | 0.007 | A | 180 |
| | C7 | Cu | 25 | A | 5% H₂ + N₂ | 0.004 | A | 120 |
| | C8 | Cu | 20 | B | pure N₂ | 0.005 | A | 180 |
| | C9 | Cu | 25 | B | pure N₂ | 0.005 | A | 180 |
| | C10 | Cu | 50 | B | 3% H₂ + Ar | 0.004 | A | 180 |

| | EXAMPLE NO. | BONDING RELIABILITY | | | | |
|---|---|---|---|---|---|---|
| | | HEATING @ 150° C. | HEATING @ 175° C. | HEATING @ 185° C. | PCT 200 h | 500 h |
| EX. OF PRESENT INVENTION | C1 | ◎ | ◎ | Δ | ◎ | ○ |
| | C2 | ◎ | ◎ | ◎ | ◎ | ◎ |
| | C3 | ◎ | ◎ | ◎ | ◎ | ◎ |
| | C4 | ◎ | ◎ | ◎ | ◎ | ◎ |
| | C5 | ◎ | ◎ | ◎ | ◎ | ◎ |
| | C6 | ◎ | ◎ | ◎ | ◎ | ◎ |
| | C7 | ◎ | ◎ | ○ | ◎ | ○ |
| | C8 | ◎ | ◎ | ○ | ◎ | ◎ |
| | C9 | ◎ | ◎ | ○ | ◎ | ◎ |
| | C10 | ◎ | Δ | X | ◎ | ○ |

TABLE 6

| | | BALL BONDED PORTION AFTER HEATING @ 175° C.-200 hr. | | | | | MULTILAYER COPPER WIRE OUTER COAT LAYER | |
|---|---|---|---|---|---|---|---|---|
| | | CONCENTRATED LAYER AT BALL BONDED BOUNDARY FACE | | THICKNESS OF CONCENTRATED LAYER WHERE CONCENTRATION OF CONCENTRATED METAL IS GREATER THAN OR EQUAL TO 1 mol % | | | | |
| | EXAMPLE NO. | CONCENTRATED METAL | THICKNESS/ μm | DIFFUSION LAYER | INTER-METALLIC COMPOUND | CONDUCTIVE METAL | LAYER THICKNESS/ μm | CONCENTRATION GRADIENT THICKNESS μm |
| EX. OF PRESENT INVENTION | C11 | Pd | 0.2 | 0.2 | — | Pd | 0.05 | 0.002 |
| | C12 | Pd | 1 | 0.8 | 0.2 | Pd | 0.1 | 0.002 |
| | C13 | Pd | 2 | 0.5 | 0.9 | Pd | 0.2 | 0.005 |
| | C14 | Pd | 2.8 | 0.6 | 2.2 | Pd | 0.6 | 0.003 |
| | C15 | Pd | 0.6 | — | 0.6 | Pd | 0.2 | 0.006 |
| | C16 | Pd | 2.2 | — | 2.2 | Pd | 0.7 | 0.009 |
| | C17 | Pt | 1.5 | 1 | — | Pt | 0.08 | 0.008 |
| | C18 | Pt | 3.7 | 2.5 | 1.2 | Pt | 1 | 0.01 |
| | C19 | Rh | 2.6 | 1.3 | 1.3 | Rh | 0.6 | 0.005 |
| | C20 | Rh | 0.9 | — | — | Rh | 0.2 | 0.002 |

TABLE 6-continued

MULTILAYER COPPER WIRE

| | EXAMPLE NO. | CORE MATERIAL | LINE DIAMETER/ μm | MANUFACTURING METHOD(A: ELECTROLESS, B: ELECTROLYTIC, C: VAPOR DEPOSITION, D: HALF-MELTING) | BALL FORMATION GAS | | | |
|---|---|---|---|---|---|---|---|---|
| | | | | | KIND OF GAS | GAS FLOW RATE m³/min | SPRAYING TECHNIQUE A: ONE DIRECTION B: TWO DIRECTION C: ANNULARLY | GAS SPRAYING ANGLE (DEGREE) |
| EX. OF PRESENT INVENTION | C11 | Cu | 50 | B | 5% H₂ + N₂ | 0.008 | A | 100 |
| | C12 | Cu | 18 | B | pure N₂ | 0.008 | A | 180 |
| | C13 | Cu | 25 | A | pure N₂ | 0.008 | A | 180 |
| | C14 | Cu | 25 | B | pure N₂ | 0.006 | A | 180 |
| | C15 | Cu | 25 | B | pure N₂ | 0.007 | A | 180 |
| | C16 | Cu | 33 | B | pure N₂ | 0.005 | A | 180 |
| | C17 | Cu | 25 | B | pure N₂ | 0.004 | A | 180 |
| | C18 | Cu | 25 | A | pure N₂ | 0.005 | A | 180 |
| | C19 | Cu | 50 | B | pure N₂ | 0.004 | A | 180 |
| | C20 | Cu | 25 | B | 3% H₂ + Ar | 0.005 | A | 120 |

| | EXAMPLE NO. | BONDING RELIABILITY | | | | |
|---|---|---|---|---|---|---|
| | | HEATING @ 150° C. | HEATING @ 175° C. | HEATING @ 185° C. | PCT 200 h | PCT 500 h |
| EX. OF PRESENT INVENTION | C11 | ◎ | ◎ | Δ | ◎ | ○ |
| | C12 | ◎ | ◎ | ◎ | ◎ | ◎ |
| | C13 | ◎ | ◎ | ◎ | ◎ | ◎ |
| | C14 | ◎ | ◎ | ◎ | ◎ | ◎ |
| | C15 | ◎ | ◎ | ◎ | ◎ | ◎ |
| | C16 | ◎ | ◎ | ◎ | ◎ | ◎ |
| | C17 | ◎ | ◎ | ○ | ◎ | ○ |
| | C18 | ◎ | ◎ | ○ | ◎ | ◎ |
| | C19 | ◎ | ◎ | ○ | ◎ | ◎ |
| | C20 | ◎ | Δ | X | ◎ | ○ |

Some of the evaluation results will be explained for representative examples of respective claims.

According to the examples A1 to A3 and B1 to B22, as a interface concentrated layer of a conductive metal of the present invention was formed in the vicinity of the interface between a ball bonded portion and an electrode and the concentration inside the concentrated layer was within a range from 0.05 to 20 mol %, a sufficient bonding reliability was ensured even though it was subjected to high temperature heating. The thickness of the concentrated layer in the vicinity of the interface was 0.05 μm. More preferably, according to the examples A1 to A3, A5, A6, A8 to A13, B2 to B12, B15 to B21, the concentration inside a concentrated layer was within a range from 0.2 to 10 mol %, and no air bubble greater than or equal to 10 μm was found, the bonding reliability after heating at 150° C. was improved. According to the examples A2, A9, A10, A12, B2 to B6, B11, B12, B16 to B18, B20 to B22 where the thickness of a interface concentrated layer was greater than or equal to 0.5 μm and no air bubble greater than or equal to 10 μm was found at a bonded portion, the bonding reliability was improved even under a more severe high temperature condition at 175° C. According to the comparative examples X1 to X5, Y1 to Y4, because no interface concentrated layer was formed or the concentration of a concentrated layer was less than 0.05 mol % even though the concentrated layer was present, the bonding reliability after high temperature heating greatly decreased.

According to the examples A2 to A13, B1 to B22, as a bonded portion having the concentrated layer of a conductive metal of the present invention formed on the surface of a ball bonded portion, a high reliability under a high temperature and high humidity condition was confirmed through a PCT. More preferably, according to the examples A3, A5 to A13, B3 to B5, B7 to B12, B14 to B22 where the concentration of a concentrated layer was within a range from 0.2 to 4 mol %, an effect of suppressing any petal-like deformation was enhanced. According to the comparative examples X1 to X5, Y1 to Y4, because no surface concentrated layer was formed or the concentration of a concentrated layer was less than 0.05 mol % even though the concentrated layer was present, the bonding reliability through a PCT greatly decreased.

According to B1 to B22, as a multilayer copper wire, having a core member mainly comprised of copper and an outer coat layer mainly composed of a conductive metal other than copper, of the present invention was used, a high wedge bonding characteristic was acquired in comparison with the examples A1 to A13 which were monolayer copper wires. Further, according to the examples B1 to B6, B10 to B18, B20 to B22, as a multilayer copper wire having an outer coat layer of a conductive metal which was Pd, a good effect of improving the wedge bonding characteristic through a low temperature connection at 150° C.

According to the examples B2 to B22, as a multilayer copper wire containing a diffusion layer having a concentration gradient of the present invention between a core member and an outer coat layer, an effect of improving the loop control characteristic and the wedge bonding characteristic simultaneously was achieved.

According to the examples B1 to B9, B11 to B22, as a multilayer copper wire that the thickness of an outer coat layer was within a range from 0.002 to 0.8 μm, an effect of improving the wedge bonding characteristic was confirmed.

More preferably, according to the examples B3 to B5, B7 to B9, B11 to B17, B19 to B22 where the thickness of an outer coat layer was 0.01 to 0.5 μm, an effect of suppressing any contamination of a capillary was enhanced, so that the usage lifetime was extended. Further, according to the examples B1 to B4, B7, B9 to B15, B17, B20 to B22 where the thickness of an outer coat layer was less than 0.2 μm, an effect of suppressing any chip damages was also confirmed.

According to the examples B1 to B11, B13 to B21, as a multilayer copper wire of the present invention that the surface concentration of a conductive layer in an outer coat layer other than copper was greater than or equal to 30 mol %, a good sphericity was achieved regarding an initial ball shape. More preferably, according to the examples B1, B3 to B6, B8, B9, B11, B14 to B17, B20, as a multilayer copper wire that the foregoing surface concentration was greater than or equal to 60 mol %, it was confirmed that the characteristic of the surface of an initial ball and the flatness thereof were good.

According to the examples A1 to A4, A6 to A13, B1 to B22, in forming a gas at the time of arc discharging according to the present invention, as a ball bonded portion that a ball was formed by melting a bonding wire while spraying a gas in the vicinity of the leading end of the wire at a flow rate of 0.00005 to 0.005 m$^3$/min was bonded, it was confirmed that the successive bonding characteristic was stable for a normal ball diameter. According to the comparative examples X2, X3 that the gas flow rate was out of the foregoing range, a failure that a device was terminated during successive operations was caused. More preferably, according to the examples A1 to A4, A7 to A13, B1 to B8, B10, B11, B13 to B16, B18 to B21 that the foregoing flow rate was within a range from 0.0001 to 0.002 m$^3$/min, an effect of improving the successive bonding characteristic for a ball bonded portion having a small diameter was achieved, and further preferably, according to the examples A2 to A4, A7 to A13, B1, B4 to B8, B10, B13 to B16, B18, B20, B21, B24 to B26 that the foregoing flow rate was within a range from 0.001 to 0.001 m$^3$/min, it was confirmed that the size of a ball bonded portion was stabilized.

Further, according to the examples A1 to A3, A6, A8, A9, A11, A13, B4, B5, B7, B8, B13, B15, B16, B19 to B21, as a method of, according to the present invention, spraying a gas from greater than or equal to two directions or annularly in forming a ball, wherein the foregoing flow rate was within a range from 0.0001 to 0.001 m$^3$/min was employed, a good effect of stabilizing the size of a ball bonded portion for a small-diameter ball was confirmed.

According to the examples A1 to A3, A5 to A9, A11 to A13, B1 to B5, B7 to B10, B12 to B18, B20 to B22, as a bonding method of the present invention in which an angle (torch angle) between the lengthwise direction of a bonding wire and the leading end of a discharge torch was within 60 degree was employed, a good effect of reducing off-centering failures for a relatively large ball diameter was achieved. According to the examples A1, A2, A4 to A7, A9, A11 to A13, B1 to B4, B6 to B11, B13 to B17, B19 to B22, as the gas spraying angle was within a range from 40 to 150 degree according to the present invention, a better effect of reducing off-centering failures for a small-diameter ball was confirmed. Here, if the number of shielding gas pipes was greater than or equal to two, if at least one of the pipes had the foregoing angle, it was confirmed that the same effect could be achieved.

According to the examples A1 to A13, B1 to B12, B15 to B22, as a bonded portion of the present invention had no air bubble greater than or equal to 10 μm inside the bonded portion or had no air-bubble trace greater than or equal to 10 μm at the surface of a ball bonded portion, the bonding strength to an electrode material and the long-term reliability in operating as an IC were comprehensively improved. Conversely, according to the examples B13, B14 that had air-bubble traces and air bubbles, there was a tendency that the long-term reliability through a high temperature heating test, a PCT and the like slightly decreased.

According to the examples A2, A4, A8, A10, A13, B1, B2, B4, B6 to B12, B17, B19, B20, B22, as a ball portion of the present invention formed by melting the leading end of a bonding wire in an Ar gas atmosphere containing hydrogen within a range from 0.02 to 20%, generation of air bubbles in an initial ball was suppressed, and the ball bonding characteristic was improved. Conversely, according to the examples A1, A3, A5 to A7, A9, A11, A12, B3, B5, B13 to B16, B18, B21 of an initial ball formed using an atmosphere gas other than a mixed gas of hydrogen and Ar, it was confirmed that air bubbles were partially generated inside a ball or at a ball bonded portion. Preferably, according to the examples A2, A4, A8, A13, B1, B2, B4, B6 to B10, B17, B19, B20, B22 that the foregoing hydrogen concentration was within a range from 0.1 to 10%, an effect of reducing the size of an air bubble inside a ball bonded portion was high, and the improvement effect was not high according to B11 as a comparison where the hydrogen concentration was 0.03%.

According to the examples A3, A9, A11, B5, B16, B18, B21, as bonding was carried out while a mixed gas of Ar and nitrogen was sprayed according to the present invention, an effect of suppressing any elliptical deformation failures was achieved.

According to the examples A2, A8, A13, B1, B2, B4, B7 to B10, B12, B20, B22, as the torch angle according to the present invention was within 60 degree from the wire lengthwise direction and a ball was formed in an atmosphere of an Ar gas containing hydrogen within a range from 0.02 to 20%, suppressing of any misalignment and suppressing of any air bubbles were satisfied at the same time. More preferably, according to the examples B1, B2, B4, B7 to B10, B12, B17, B20, B22 of a multilayer copper wire that had the foregoing torch angle and the gas condition, a better effect of suppressing any misalignment and any air bubbles simultaneously was achieved. As a comparison, according to the examples B6, B11, B19 that the torch angle was over 60 degree, off-centering was confirmed.

The examples C1 to C10 correspond to the present invention as set forth in claims 1 and 4, and achieved the effects of both cases. In particular, according to the examples C2 to C9, as at least a part of a interface concentrated layer formed at the interface of a ball bonded portion was formed inside either one of a diffusion layer mainly composed of the primary element of an electrode and copper or an intermetallic compound, it was confirmed that the bonding reliability at a high temperature was improved. In categorizing the examples, according to the examples C1 to C6, as a concentrated metal was Pd and a interface concentrated layer was formed inside the diffusion layer or the intermetallic compound, a good effect of improving the bonding reliability at an ultrahigh temperature of 185° C. was confirmed. According to the examples C7 to C9, regarding the reliability at a high temperature of 175° C. that it was difficult to improve the bonding reliability since a concentrated metal was not Pd, because a interface concentrated layer was formed inside the diffusion layer or the intermetallic compound, it was confirmed that the reliability was improved. As a comparison, according to the example C10, because a interface concentrated layer was not formed inside the diffusion layer or the intermetallic compound, the bonding reliability was not always sufficient at an ultrahigh temperature of 185° C. Moreover, according to the examples C2 to C6, C8, C9, because at least a part of a interface concentrated layer was formed inside the intermetallic compound, no failure occurred until 500 hours of a long time in a PCT, and a good high temperature and high humidity characteristic was confirmed.

According to the examples C11 to C19, a bonded portion was analyzed after a semiconductor device was heated for 200 hours at 175° C., and as at least a part of a interface concentrated layer formed at the boundary of a ball bonded portion was formed inside either one of a diffusion layer mainly composed of the primary element of an electrode and copper or an intermetallic compound, it was confirmed that the bonding reliability at a high temperature was improved. In categorizing the examples, according to the examples C11 to C16, as a concentrated metal was Pd and a interface concentrated layer was formed inside the diffusion layer or the intermetallic compound, a good effect of improving the bonding reliability at an ultrahigh temperature of 185° C. was confirmed. According to the examples C17 to C19, regarding a reliability at a high temperature of 175° C. that it was difficult to improve the bonding reliability as a concentrated metal was not Pd, because a interface concentrated layer was formed inside the diffusion layer or the intermetallic compound, it was confirmed that the bonding reliability was improved. As a comparison, according to the example C20, because a interface concentrated layer was not formed inside a diffusion layer and an intermetallic compound at a ball bonded portion heated for 200 hours at 175° C., the bonding reliability at an ultrahigh temperature of 185° C. was not always sufficient. Moreover, according to the examples C12 to C16, C18, C19, as at least a part of a interface concentrated layer was formed inside an intermetallic compound, no failure occurred until 500 hours of a long time in a PCT, and a good high temperature and high humidity characteristic was confirmed.

The invention claimed is:

1. A bonding structure of a wire connected to an electrode of a semiconductor device through a ball bonded portion, comprising:
    a bonding wire composed of copper as a main component and a conductive metal other than copper; and
    a concentrated layer comprising the conductive metal formed at an interface between the ball bonded portion and the electrode,
    wherein the concentrated layer has a high concentration of the conductive metal and has an area in which the concentration of the conductive metal is 0.05 to 20 mol %, said area having a thickness greater than or equal to 0.1 µm.

2. The bonding-wire bonding structure according to claim 1, wherein the concentrated layer is formed at the surface of the ball bonded portion as well.

3. The bonding-wire bonding structure according to claim 2, wherein the concentrated layer formed at the surface of the ball bonded portion has an area where the concentration of the conductive metal is 0.05 to 10 mol %, said area having a thickness greater than or equal to 0.1 µm.

4. The bonding-wire bonding structure according to claim 1, wherein the concentration of the conductive metal in the concentrated layer is greater than or equal to five times as much as an average concentration of the conductive metal at the ball bonded portion other than the concentrated layer.

5. The bonding-wire bonding structure according to claim 1, wherein the bonding wire comprises a core member mainly composed of copper and an outer coat layer mainly composed of the conductive metal and covering the core member.

6. The bonding-wire bonding structure according to claim 1, wherein the conductive metal is palladium or platinum.

7. The bonding-wire bonding structure according to claim 1, wherein an inside of the ball bonded portion lacks the formation of air bubble having a diameter greater than or equal to 10 µm.

8. The bonding-wire bonding structure according to claim 2, wherein a surface of the ball bonded portion lacks an air-bubble trace having a diameter greater than or equal to 10 µm.

9. A method of forming a bonding-wire bonding structure according to claim 1, comprising: a step of melting the leading end of the bonding wire by generating arc discharge between the bonding wire and a discharge torch to form the ball bonded portion.

10. The method according to claim 9, further comprising the step of forming the ball bonded portion while maintaining an angle of a line, interconnecting the leading end of the bonding wire and the leading end of the discharge torch, relative to the lengthwise direction of the bonding wire within 60 degree.

11. The method according to claim 9, further comprising the step of forming the ball bonded portion while spraying an inert gas or a reducing gas in the vicinity of the leading end of the bonding wire at a flow rate of 0.00005 to 0.005 m$^3$/min.

12. The bonding-wire bonding structure according to claim 1, wherein at least a part of the concentrated layer formed at the interface between the ball bonded portion and the electrode is formed inside at least either one of a diffusion layer and an intermetallic compound that are mainly composed of the primary element of the electrode and copper.

13. The bonding-wire bonding structure according to claim 12, wherein at least a part of the concentrated layer is formed inside at least either one of the diffusion layer or the intermetallic compound, and an area where the concentration of the conductive metal is 0.5 to 30 mol % has a thickness greater than or equal to 0.01 µm.

14. The bonding-wire bonding structure according to claim 1, wherein the concentrated layer is formed at the interface between the ball bonded portion and the electrode after the ball bonded portion is heated for 200 hours at 175° C., and an area where the concentration of the conductive metal is greater than or equal to 1 mol % has a thickness greater than or equal to 0.2 µm.

15. The bonding-wire bonding structure according to claim 2, wherein the concentration of the conductive metal in the concentrated layer is greater than or equal to five times as much as an average concentration of the conductive metal at the ball bonded portion other than the concentrated layer.

16. The bonding-wire bonding structure according to claim 1, wherein the bonding wire comprises a core member mainly composed of copper and an outer coat layer mainly composed of the conductive metal and covering the core member.

17. The bonding-wire bonding structure according to claim 2, wherein the bonding wire comprises a core member mainly composed of copper and an outer coat layer mainly composed of the conductive metal and covering the core member.

18. The bonding-wire bonding structure according to claim 3, wherein the bonding wire comprises a core member mainly composed of copper and an outer coat layer mainly composed of the conductive metal and covering the core member.

19. The bonding-wire bonding structure according to claim 2, wherein the conductive metal is palladium or platinum.

20. The bonding-wire bonding structure according to claim 5, wherein the conductive metal is palladium or platinum.

21. The bonding-wire bonding structure according to claim 16, wherein the conductive metal is palladium or platinum.

22. The bonding-wire bonding structure according to claim 18, wherein the conductive metal is palladium or platinum.

23. The bonding-wire bonding structure according to claim 16, wherein the outer coat layer has a thickness of 0.002 to 0.8 µm.

24. The bonding-wire bonding structure according to claim 18, wherein the outer coat layer has a thickness of 0.002 to 0.8 µm.

25. The bonding-wire bonding structure according to claim 16, wherein a diffusion layer where copper and the conductive metal have a concentration gradient is formed between the core member and the outer coat layer.

26. The bonding-wire bonding structure according to claim 18, wherein a diffusion layer where copper and the conductive metal have a concentration gradient is formed between the core member and the outer coat layer.

* * * * *